United States Patent
Glavicic

(10) Patent No.: US 11,257,631 B2
(45) Date of Patent: Feb. 22, 2022

(54) MATERIAL PROPERTY CAPACITANCE SENSOR

(71) Applicant: Rolls-Royce Corporation, Indianapolis, IN (US)

(72) Inventor: Michael George Glavicic, Avon, IN (US)

(73) Assignee: ROLLS-ROYCE CORPORATION, Indianapolis, IN (US)

(*) Notice: Subject to any disclaimer, the term of this patent is extended or adjusted under 35 U.S.C. 154(b) by 0 days.

(21) Appl. No.: 16/853,219

(22) Filed: Apr. 20, 2020

(65) Prior Publication Data

US 2020/0251290 A1 Aug. 6, 2020

Related U.S. Application Data

(63) Continuation of application No. 15/897,094, filed on Feb. 14, 2018, now Pat. No. 10,636,583.
(Continued)

(51) Int. Cl.
*B41J 2/06* (2006.01)
*B41J 2/45* (2006.01)
(Continued)

(52) U.S. Cl.
CPC .............. *H01G 11/24* (2013.01); *C08J 5/048* (2013.01); *C08J 5/06* (2013.01); *G01N 27/22* (2013.01);
(Continued)

(58) Field of Classification Search
CPC ... H01L 23/49838; H01L 24/16; H01L 24/17; H01L 24/49; H01L 24/97; H01L 25/0657;
(Continued)

(56) References Cited

U.S. PATENT DOCUMENTS 6,166,558 A 12/2000 Jiang et al.
2004/0178805 A1 9/2004 Kitaoka
(Continued)

OTHER PUBLICATIONS

Adamyan et al., "Capacitance method for determination of basic parameters of porous silicon", Apr. 2007, 6 pgs.
(Continued)

*Primary Examiner* — Brian Turner
(74) *Attorney, Agent, or Firm* — Shumaker & Sieffert, P.A.

(57) ABSTRACT

A system may include a controller configured to cause a capacitance probe to subject a material to a first electric signal having a first frequency and determine a first capacitance of the material at the first frequency. The controller is configured to cause the capacitance probe to subject the material to a second electric signal at a second frequency and determine a second capacitance of the material at the second frequency. The material includes at least a first constituent phase and a second constituent phase. The first constituent phase and the second constituent phase have substantially similar dielectric constants at the first frequency and substantially different dielectric constants at the second frequency. The controller is further configured to determine a porosity of the material based on the first capacitance and determine a relative phase composition of the first constituent phase and the second constituent phase based on the second capacitance.

20 Claims, 11 Drawing Sheets

Related U.S. Application Data

(60) Provisional application No. 62/458,801, filed on Feb. 14, 2017.

(51) Int. Cl.

| | | |
|---|---|---|
| *H01L 21/302* | (2006.01) | |
| *H01L 21/3105* | (2006.01) | |
| *H01L 21/768* | (2006.01) | |
| *H01G 11/24* | (2013.01) | |
| *C08J 5/04* | (2006.01) | |
| *G01R 27/26* | (2006.01) | |
| *C08J 5/06* | (2006.01) | |
| *H01L 51/00* | (2006.01) | |
| *H05K 1/03* | (2006.01) | |
| *G01N 27/22* | (2006.01) | |

(52) U.S. Cl.
CPC ....... *G01N 27/221* (2013.01); *G01R 27/2605* (2013.01); *H01L 51/0096* (2013.01); *H05K 1/036* (2013.01)

(58) Field of Classification Search
CPC ............. H01L 24/32; H01L 2924/1517; H01L 2224/29111; H01L 2224/29139; H01L 2224/81191; H01L 2224/131; H01L 2224/0401; H05K 3/3436
See application file for complete search history.

(56) References Cited

U.S. PATENT DOCUMENTS

| | | | |
|---|---|---|---|
| 2004/0248426 A1 | 12/2004 | Chou et al. | |
| 2012/0013354 A1* | 1/2012 | Bowler | G01N 27/226 324/664 |
| 2013/0193551 A1 | 8/2013 | Edelstein et al. | |
| 2014/0233152 A1 | 8/2014 | Gardner et al. | |
| 2014/0252686 A1 | 9/2014 | Bouillon et al. | |
| 2014/0380531 A1* | 12/2014 | Ukraintsev | G01Q 30/04 850/3 |
| 2015/0104953 A1 | 4/2015 | Shih et al. | |
| 2015/0109655 A1* | 4/2015 | Vigneron | G02B 5/285 359/290 |
| 2016/0216224 A1 | 7/2016 | King et al. | |
| 2016/0293407 A1 | 10/2016 | Dubois et al. | |
| 2018/0233298 A1 | 8/2018 | Glavicic | |

OTHER PUBLICATIONS

Terzic et al., "A Neural Network Approach to Fluid Quantity Measurement in Dynamic Environments" Chapter 2-Capacitive Sensing Technology, 2012, 28 pgs. Applicant points out, in accordance with MPEP 609.04(a), that the year of publication, 2012, is sufficiently earlier than the effective U.S. filing date, 2018, so that the particular month of publication is not in issue.

Glavicic, "Development and application of techniques for the microstructural characterization of hydrogen permeability n zirconium oxides" Chapter 6—Porosity Measurements, 1998, 16 pgs. Applicant points out, in accordance with MPEP 609.04(a), that the year of publication, 1998, is sufficiently earlier than the effective U.S. filing date, 2018, so that the particular month of publication is not in issue.

International Search Report and Written Opinion of International Application No. PCT/US2018/018192, dated May 4, 2018, 17 pp.
International Preliminary Report on Patentability from international application No. PCT/US2018/018192, dated Aug. 29, 2019, 10 pp.
Prosecution history from U.S. Appl. No. 15/897,094 dated Mar. 19, 2019 through Mar. 17, 2020, 89 pgs.

\* cited by examiner

MATERIAL PROPERTY CAPACITANCE SENSOR

This application is a continuation of U.S. application Ser. No. 15/897,094, filed Feb. 14, 2018, which claims the benefit of U.S. Provisional Application No. 62/458,801, filed Feb. 14, 2017, both of which are incorporated herein by reference in their entirety.

TECHNICAL FIELD

The disclosure relates to material composition and porosity detection.

BACKGROUND

A ceramic matrix composite (CMC) includes ceramic fibers embedded in a ceramic matrix. CMCs may have desirable mechanical, physical, and chemical properties such as high fracture toughness, thermal shock resistance, and elongation resistance. CMCs may be used for a variety of applications such as gas turbine engines, brake discs, and the like. An example CMC is silicon carbide-fiber reinforced silicon carbide (SiC/SiC) composite.

The ceramic fibers and ceramic matrix of a CMC may not be evenly distributed throughout a CMC article, leading to spatial differences in CMC composition. Further, in some examples, a CMC may include unwanted porosity. For example, a first portion of a CMC article may have a different composition of ceramic fibers and matrix material than a second portion of the CMC article. The CMC article may further include a coating that has an uneven porosity or layer thickness.

SUMMARY

In some examples, the disclosure describes a method that includes causing, by a controller, a capacitance probe to subject a material to an electric signal. The method further includes determining, by the controller, a capacitance of the material and a porosity of the material based on the capacitance.

In some examples, the disclosure describes a method that includes causing, by a controller, a capacitance probe to subject a material to an electric signal having a frequency. The material includes at least a first constituent phase and a second constituent phase. The first constituent phase and the second constituent phase have substantially different dielectric constants at the frequency. The method further includes determining, by the controller, a capacitance of the material at the frequency and a relative phase composition of the first constituent phase and the second constituent phase based on the capacitance.

In some examples, the disclosure describes a method that includes causing, by a controller, a capacitance probe to subject a first material to a first electric signal. The method further includes determining, by the controller, a first capacitance of the first material. The method further includes causing, by the controller, the capacitance probe to subject the first material and a second material on the first material to a second electric signal. The method further includes determining, by the controller, a second capacitance of the first material and the second material, and a porosity of the second material based on the first capacitance and the second capacitance.

In some examples, the disclosure describes a method that includes causing, by a controller, a capacitance probe to subject a first material to a first electric signal having a frequency. The method further includes determining, by the controller, a first capacitance of the first material. The method further includes causing, by the controller, the capacitance probe to subject the first material and a second material on the first material to a second electric signal having the frequency. The second material includes at least a first constituent phase and a second constituent phase. The first constituent phase and the second constituent phase have substantially different dielectric constants at the frequency. The method further includes determining, by the controller, a second capacitance of the first material and the second material, and a relative phase composition of the first constituent phase and the second constituent phase based on the first capacitance and the second capacitance.

In some examples, the disclosure describes a system that includes a controller configured to cause a capacitance probe to subject a material to an electric signal, determine a capacitance of the material, and determine a porosity of the material based on the capacitance.

In some examples, the disclosure describes a system that includes a controller configured to cause a capacitance probe to subject a material to an electric signal at a frequency. The material includes at least a first constituent phase and a second constituent phase. The first constituent phase and the second constituent phase have substantially different dielectric constants at the frequency. The controller is further configured to determine a capacitance of the material and a relative phase composition of the first constituent phase and the second constituent phase based on the capacitance.

In some examples, the disclosure describes a system that includes a controller configured to cause a capacitance probe to subject a material to a first electric signal having a first frequency and determine a first capacitance of the material at the first frequency. The controller is configured to cause the capacitance probe to subject the material to a second electric signal at a second frequency and determine a second capacitance of the material at the second frequency. The material includes at least a first constituent phase and a second constituent phase. The first constituent phase and the second constituent phase have substantially similar dielectric constants at the first frequency and substantially different dielectric constants at the second frequency. The controller is further configured to determine a porosity of the material based on the first capacitance and determine a relative phase composition of the first constituent phase and the second constituent phase based on the second capacitance.

The details of one or more examples are set forth in the accompanying drawings and the description below. Other features, objects, and advantages of the disclosure will be apparent from the description and drawings, and from the claims.

DETAILED DESCRIPTION

Figure 1:
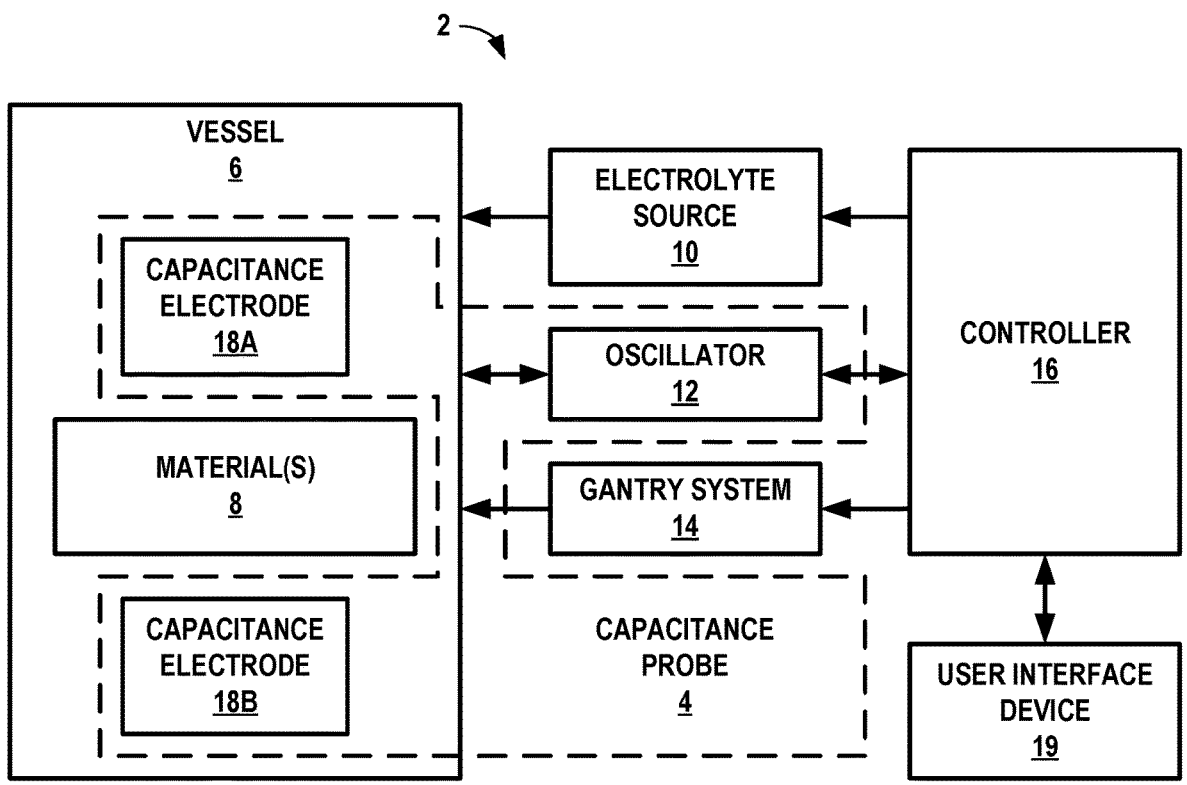
FIG. 1 is a conceptual and schematic block diagram illustrating an example system for determining compositional properties of a material using capacitance.

The disclosure describes systems and techniques for determining properties of a material, including compositions and porosities, using capacitance measurements. For example, the systems and techniques described herein may be used to determine porosity, open porosity, closed porosity, material or phase composition, material thickness, and the like based on capacitance measurements of the material. In some examples, the systems and techniques described herein may be performed at a plurality of positions for portions of the material, and a controller may be configured to generate a representation of one or more of these characteristics as a function of position. Additionally or alternatively, the systems and techniques described herein may be used to characterize a base material (e.g., a substrate), and one or more coating layers by performing the techniques first on the base material and then on the base material and one or more coating layers.

A capacitance of a material may generally be represented by the following equation:

$$C = \frac{\varepsilon_0 \varepsilon_R A}{d},$$

where $\varepsilon_0$ is an electric field permittivity of free space (also referred to as a "free permittivity"), $\varepsilon_R$ is a relative permittivity of the material, A is the surface area of each of a pair of conductive plates in a capacitance probe, and d is a distance between the pair of conductive plates. The relative permittivity of the material, $\varepsilon_R$, (also referred to as a "dielectric constant", used interchangeably herein) may represent a permittivity of one or more materials between the pair of conductive plates relative to the permittivity of a vacuum. The relative permittivity of the material may represent the material's influence on an electric field applied to the material. The relative permittivity, $\varepsilon_R$, may be generally expressed as a ratio of an absolute permittivity of the material to the vacuum permittivity; alternatively, the relative permittivity $\varepsilon_R$ may be expressed as a ratio of a capacitance $C_M$ of a capacitor using the material as a dielectric to a capacitance $C_0$ of a similar capacitor using a vacuum (or, in the case of a relatively high dielectric of the material, air) as a dielectric. The relative permittivity of the material may generally be represented by the following equation:

$$\varepsilon_R = \frac{\varepsilon_M}{\varepsilon_0} = \frac{C_M}{C_0},$$

where $\varepsilon_M$ is the absolute permittivity of the material, $C_M$ is the capacitance of the material, and $C_0$ is the vacuum capacitance. The table below shows various static dielectric constants for materials found in CMCs.

| Material | Dielectric Constant (Static) |
| --- | --- |
| Air | 1 |
| Silicon (Si) | 11.7 |
| Silicon Carbine (SiC—3C) | 9.72 |
| Silicon Carbine (SiC—6H) | 9.66 |

A material may include more than one constituent. Each constituent may behave as a dielectric capacitor by contributing to capacitance according to its dimensional and compositional properties, such as thickness, orientation, and relative permittivity. For example, two constituents arranged in horizontal layers, such as for a coating, may have a total capacitance according to the following equation:

$$\frac{1}{C_M} = \Sigma \frac{1}{C_N} = \frac{1}{C_1} + \frac{1}{C_2},$$

where $C_N$ is the capacitance of each constituent, $C_1$ is the capacitance of the first layer, and $C_2$ is the capacitance of the second layer. As another example, two constituents arranged in vertical columns, such as at a boundary, may have a total capacitance according to the following equation:

$$C_M = \Sigma C_N = C_1 + C_2,$$

where $C_1$ is the capacitance of the first column and $C_2$ is the capacitance of the second column. As yet another example, four constituents arranged in two vertical columns of two horizontal layers each may have a total capacitance according to the following equation:

$$C_M = \frac{C_1 C_2}{C_1 + C_2} + \frac{C_3 C_4}{C_3 + C_4},$$

where $C_1$ is the capacitance of the first layer of the first column, $C_2$ is the capacitance of the second layer of the first column, $C_3$ is the capacitance of the first layer of the second column, and $C_4$ is the capacitance of the second layer of the second column.

The relative permittivity of a portion of a material may be a function of various compositional properties of the material, including chemistry, crystal structure or phase composition, and porosity. In a non-homogenous material, the relative permittivity may depend on various constituents of the material between the capacitive plates, such as different crystal structures or phase constitutions, porosity, material compositions, and material thicknesses, which may vary throughout portions of the material. For example, the relative permittivity of a substantially uniform non-homogeneous material having two or more constituents may generally be a summation of the product of a volume fraction and relative permittivity of each constituent, and may generally be represented by the following equations:

$$\varepsilon_R = \Sigma \varepsilon_{R,i} V_i \text{ and } \Sigma V_i = 1,$$

where i is the constituent, $\varepsilon_{R,i}$ is the relative permittivity of the constituent, and $V_i$ is the volume fraction of the constituent.

The relative permittivity of materials may also vary with the frequency of the electric field applied to the material and temperature of the materials. For example, two constituent phases in a material may have different dielectric constants at a first frequency and similar dielectric constants at a second frequency.

In some examples, a system for determining compositional properties of a material may include a capacitance probe and a controller. The capacitance probe may be configured to subject the material to at least one electric signal having a selected frequency. The controller may be configured to determine at least one capacitance of the material at the frequency and determine a compositional property, such as porosity or phase composition, of the material based on the at least one capacitance.

In some examples, the controller may determine a phase composition of the material using capacitance. The material may include at least two constituent phases that have substantially different dielectric constants at at least one frequency. The controller may cause a capacitance probe to subject the material to an electric signal, such as an electric field, having the particular frequency and the controller may determine the capacitance of the material at the particular frequency. The controller may determine a relative phase composition of the constituent phases based on the relative contribution of each constituent phase to the capacitance, e.g., based on the static dielectric constants of the constituent phases.

In some examples, a controller may determine a porosity of a material using capacitance. The material may be homogeneous or may be non-homogeneous with constituent phases having substantially similar dielectric constants at a particular frequency. The controller may cause a capacitance probe to subject the material to an electric signal, such as an electric field, at the particular frequency, and the controller may determine a capacitance of the material. The controller may determine a porosity of the material based on the relative contribution of the material and the pore medium to the capacitance, e.g., based on the static dielectric constants of the constituent phases.

In some examples, the controller may determine a phase composition and/or a porosity of a material using capacitance at different frequencies to allow for differentiation of more than two constituents. The material may have a first constituent phase, a second constituent phase, and pores with a pore medium. The first constituent phase and the second constituent phase may have different dielectric constants at a first frequency and similar dielectric constants at a second frequency, while the pore medium may have a substantially constant dielectric constant that is significantly smaller than the dielectric constants of the first constituent phase and the second constituent phase. To determine relative phase composition, the controller may cause the capacitance probe to subject the material to an electric signal at the first frequency. The controller may determine a relative phase composition of the constituent phases based on the relative contribution of each constituent phase to the capacitance, as the first constituent phase and the second constituent phase may have substantially different dielectric constants at the first frequency and their respective phase compositions may be differentiated. To determine porosity, the controller may cause the capacitance probe to subject the material to an electric signal at the second frequency. The controller may determine a porosity based on the relative contribution of the pore medium and the first and second constituent phases to the capacitance, as the first constituent phase and the second constituent phase may have substantially similar dielectric constants at the second frequency and the porosity may be differentiated.

In some examples, the controller may determine a volume fraction of open porosity and a volume fraction of closed porosity, or volumetric ratio of both, using capacitance measurements. The material may include both open and closed pores. The controller may cause a capacitance probe to subject the material to an electric signal and controller may determine the capacitance of the material. In a separate measurement, the material may be submerged in an electrolyte solution, which may substantially fill open pores of the material and remove the contribution of air in the open pores to the capacitance. The capacitance probe may subject the material to the electric signal and the controller may determine a capacitance of the material while the material is submerged in the electrolyte solution. The controller may determine a volume fraction of closed porosity and a volume fraction of open porosity of the material based on the relative difference in the capacitance of the material with and without the electrolyte solution.

In some examples, a controller may use capacitance measurements to evaluate characteristics of a second material, such as a coating, on a first material, such as a substrate. For example, after determining a capacitance of the first material as described above, the second material may be deposited or applied to the first material. The controller then may cause the capacitance probe to subject the combination of the first material and the second material to an electric signal and may determine a capacitance of the first material and the second material. The controller may determine the porosity of the second material based on the difference between the first capacitance and the second capacitance, and the relative contribution of the second material and the pore medium to the difference in capacitance. In some examples, if the porosity of the second material is outside of a predetermined range, the first and second material may be rejected or undergo further processing.

These techniques may provide faster and less expensive non-destructive methods for determining compositional properties of materials, e.g., compared to mercury porosimetry, electron microscopy, x-ray tomography, gravimetric methods, or the like.

FIG. 1 is a conceptual and schematic block diagram illustrating an example system 2 for determining compositional properties of a material 8 using capacitance. System 2 includes capacitance probe 4 and controller 16. In some examples, as shown in FIG. 1, system 2 may optionally include vessel 6, electrolyte source 10, gantry system 14, user interface device 19, or any combination thereof.

Material 8 may include any material having a dielectric constant capable of affecting an electric field applied to material 8 by capacitance probe 4. In some examples, material 8 may be a material having at least two phase constituents. For example, material 8 may have a first constituent phase having a first crystal structure and a second constituent phase having a second crystal structure. Each constituent phase may have an associated dielectric constant. In some examples, at least two constituent phases have substantially similar dielectric constants. In some examples, at least two constituent phases have substantially different dielectric constants. The dielectric constants may change as a function of applied frequency, and, in some examples, the first dielectric constant may change differently with applied frequency than the second dielectric constant. In some instances, the first and second dielectric constants may be substantially the same at a first frequency and different at a second frequency.

In some examples, material 8 may be a porous material. A porous material may include any material with open pores, closed pores, or both containing a pore medium different than the porous material. For example, the pore medium may include air. Porous materials may include, but are not limited to, polymers, foams, composites, and the like.

In some examples, material 8 may have more than one constituent, such as more than one layer. For example, material 8 may include a first material, such as substrate, and a second material on the first material as a coating. Example substrates include metals, alloys, ceramics, ceramic matrix composites, and the like. Example coatings include bond coatings, thermal barrier coatings (TBCs), environmental barrier coatings (EBCs), calcia-magnesia-alumina-silicate (CMAS) resistant coatings, abradable coatings, and the like.

In some examples, material 8 may include a ceramic matrix composite (CMC). A CMC may include ceramic reinforcement material and ceramic matrix material. In some examples, material 8 may include a plurality of CMC layers. For example, a first CMC layer may be selected to carry an applied load, while a second CMC layer may be selected to transfer the applied load to an underlying component. In some examples, the composition of the ceramic matrix material is the same as the composition of the ceramic reinforcement material. The ceramic matrix material may include, but is not limited to, silicon carbide (SiC), silicon nitride ($Si_3N_4$), alumina ($Al_2O_3$), aluminosilicate (e.g., $Al_2SiO_5$), silica ($SiO_2$), molybdenum carbide ($Mo_2C$), and the like.

The composition, shape, size, and the like, of the ceramic reinforcement material may be selected to provide the desired properties to the CMC. In some examples, the ceramic reinforcement material may be chosen to increase the toughness of a brittle matrix material. In some examples, the ceramic reinforcement material may provide structural support to material 8. The ceramic matrix material may be chosen to modify a thermal conductivity, electrical conductivity, thermal expansion coefficient, hardness, or the like, of material 8. The ceramic reinforcement material may include, but is not limited to, SiC, $Si_3N_4$, $Al_2O_3$, aluminosilicate, $SiO_2$, $Mo_2C$, and the like. The ceramic fibers may have a variety of configurations including, but not limited to, discontinuous forms such as whiskers, platelets, or particulates, or continuous forms, such as a continuous monofilament or multifilament weave. In some examples, the ceramic reinforcement material may be the same composition as the ceramic matrix material.

In some examples, material 8 may include a coating. The coating may be selected to provide protective or functional properties to material 8. The coating may include, for example, an EBC, a TBC, a CMAS-resistant coating, an abradable coating, or the like. In some examples, a single coating may perform two or more of these functions. For example, an EBC may provide environmental protection, thermal protection, and CMAS-resistance to material 8. In some examples, instead of including a single coating, material 8 may include a plurality of overlying coatings, such as at least one EBC, at least one TBC layer, at least one CMAS-resistant layer, at least one abradable coating, or combinations thereof.

In some examples, material 8 may include a bond coat that includes any useful material to improve adhesion between a first layer of material 8 (e.g., a substrate) and subsequent layer(s) applied to the bond coat. For example, the bond coat may be formulated to exhibit desired chemical or physical attraction between a CMC and any subsequent coating applied to the bond coat. In some examples, the bond coat may include silicon metal, alone, or mixed with at least one other constituent including, for example, at least one of a transition metal carbide, a transition metal boride, or a transition metal nitride. Representative transition metals include, for example, Cr, Mo, Nb, W, Ti, Ta, Hf, or Zr. In some examples, the bond coat may additionally or alternatively include mullite (aluminum silicate, $Al_6Si_2O_{13}$), silica, silicon carbide, a silicide, a rare earth silicate, or the like, alone, or in any combination (including in combination with one or more of silicon metal, a transition metal carbide, a transition metal boride, or a transition metal nitride).

Additionally or alternatively, a coating of material 8 may include an EBC, which may provide environmental protection, thermal protection, and/or CMAS-resistance to material 8. An EBC may include materials that are resistant to oxidation or water vapor attack, and/or provide at least one of water vapor stability, chemical stability and environmental durability to material 8. In some examples, the EBC may be used to protect a CMC against oxidation and/or corrosive attacks at high operating temperatures. An EBC coating may include at least one of a free rare earth oxide, silica, alumina, a rare earth silicate, an aluminosilicate, or an alkaline earth aluminosilicate. For example, an EBC coating may include mullite, barium strontium aluminosilicate (BSAS), barium aluminosilicate (BAS), strontium aluminosilicate (SAS), at least one free rare earth oxide, at least one rare earth monosilicate ($RE_2SiO_5$, where RE is a rare earth element), at least one rare earth disilicate ($RE_2Si_2O_7$, where RE is a rare earth element), or combinations thereof. The rare earth element in the at least one free rare earth oxide, the at least one rare earth monosilicate, or the at least one rare earth disilicate may include at least one of Lu (lutetium), Yb (ytterbium), Tm (thulium), Er (erbium), Ho (holmium), Dy (dysprosium), Tb (terbium), Gd (gadolinium), Eu (europium), Sm (samarium), Pm (promethium), Nd (neodymium), Pr (praseodymium), Ce (cerium), La (lanthanum), Y (yttrium), or Sc (scandium). In some examples, the at least one rare earth oxide includes an oxide of at least one of Yb, Y, Gd, or Er.

In some examples, the EBC coating may have a dense microstructure, a columnar microstructure, or a combination of dense and columnar microstructures. A dense microstructure may be more effective in preventing the infiltration of CMAS and other environmental contaminants, while a columnar microstructure may be more strain tolerant during thermal cycling. A combination of dense and columnar microstructures may be more effective in preventing the infiltration of CMAS or other environmental contaminants than a fully columnar microstructure while being more strain tolerant during thermal cycling than a fully dense microstructure. In some examples, an EBC coating with a dense microstructure may have a porosity of less than about 20 vol. %, such as less than about 15 vol. %, less than 10 vol. %, or less than about 5 vol. %, where porosity is measured as a percentage of pore volume divided by total volume of the EBC coating.

In some examples, the EBC may act as a thermal barrier coating (TBC). The TBC may include at least one of a variety of materials having a relatively low thermal conductivity, and may be formed as a porous or a columnar structure in order to further reduce thermal conductivity of the TBC and provide thermal insulation to material 8. In some examples, the TBC may include materials such as ceramic, metal, glass, or the like. In some examples, the TBC may include silicon carbide, silicon nitride, boron carbide, aluminum oxide, cordierite, molybdenum disilicide, titanium carbide, stabilized zirconia, stabilized hafnia, or the like.

Additionally or alternatively, a coating may include an abradable layer. The abradable layer may include at least one of a free rare earth oxide, a rare earth silicate, an aluminosilicate, or an alkaline earth aluminosilicate. For example, an EBC coating may include mullite, barium strontium aluminosilicate (BSAS), barium aluminosilicate (BAS), strontium aluminosilicate (SAS), at least one free rare earth oxide, at least one rare earth monosilicate ($RE_2SiO_5$, where RE is a rare earth element), at least one rare earth disilicate ($RE_2Si_2O_7$, where RE is a rare earth element), or combinations thereof.

The abradable layer may be porous. Porosity of the abradable layer may reduce a thermal conductivity of the abradable layer and/or may affect the abradability of the abradable layer. In some examples, the abradable layer includes porosity between about 10 vol. % and about 50 vol. %. In other examples, the abradable layer includes porosity between about 15 vol. % and about 35 vol. %, or about 20 vol. %. Porosity of the abradable layer is defined herein as a volume of pores or cracks in the abradable layer divided by a total volume of the abradable layer (including both the volume of material in the abradable layer and the volume of pores/cracks in the abradable layer).

System 2 may include vessel 6. Vessel 6 may be configured to house material 8 and part or all of capacitance probe 4, such as capacitance electrodes 18. Vessel 6 may also include equipment related to electrolyte source 10 or gantry system 14. For example, vessel 6 may include equipment for distributing electrolyte solution to at least one surface of material 8, such as a spray device. As another example, vessel 6 may include insulators, baffles, or gaskets for containing electrolyte solution. As another example, vessel 6 may include part or all of gantry system 14, such as linear drive actuators coupled to capacitance electrodes 18.

System 2 may include electrolyte source 10. Electrolyte source 10 may be configured to provide vessel 6 with electrolyte solution for application of electrolyte solution to material 8. In some examples, electrolyte source 10 may be communicatively coupled to controller 16. In some examples, controller 16 may control flow of electrolyte solution to material 8, such as by changing a position of a flow rate valve. The electrolyte of electrolyte source 10 may include any electrolyte that exhibits a substantially small effect on capacitance. In some examples, the electrolyte of electrolyte source 10 may have a dielectric constant of less than 0.1.

System 2 may include gantry system 14. Gantry system 14 may be configured to change the spatial relationship between capacitance probe 4 and material 8 for determination of a capacitance of at least two portions of material 8. Gantry system 14 may move material 8, capacitance electrodes 18, or any combination thereof. For example, gantry system 14 may move capacitance electrodes 18 along an x-y plane of material 8. Gantry system 14 may include, but is not limited to, linear drive systems, articulation systems, or other gantry positioning system. In some example, gantry system 14 may be communicatively coupled to controller 16. In some examples, controller 16 may control the positioning of gantry system 14, which may include capacitive electrodes 18, such as by controlling a linear drive of an actuator.

System 2 includes capacitance probe 4. Capacitance probe 4 may include capacitance electrodes 18A and 18B (referred to collectively as "capacitance electrodes 18") and oscillator 12. Capacitance probe 4 may be configured to subject material 8 to an electric signal and return feedback to controller 16. The electric signal may be an oscillating electric field having a selected frequency. Capacitance probe 4 may output, such as to controller 16, an indication signal, such as a voltage, that corresponds to the capacitance of material 8, or a combination of materials between capacitance electrodes 18. The capacitance may be a function of a dielectric constant of material 8, as well as dielectric constants of other materials affecting capacitance probe 4.

Capacitance probe 4 may include at least a pair of capacitance electrodes 18 configured to function as capacitor plates, each plate having an area. Capacitance electrodes 18 may be separated by a distance that defines a gap. Capacitance electrodes 18 may be spaced to accommodate material 8, so that material 8 may be placed in the gap between capacitance electrodes 18. Materials in the gap between capacitance electrodes 18 having a dielectric constant may affect the capacitance between capacitance electrodes 18.

Capacitance probe 4 also may include oscillator 12. Oscillator 12 may be electrically coupled to capacitance electrodes 18. Oscillator 12 may be configured to produce an alternating electric field between capacitance electrodes 18. The alternating electric field may have a selected frequency. Further, oscillator 12 may be configured to detect feedback from at least one of capacitance electrodes 18 that corresponds to a capacitance between capacitance electrodes 18. Oscillator 12 may include, for example, a capacitor, an inductor, a power source, or the like.

System 2 also includes controller 16, which is communicatively coupled to at least capacitance probe 4. Controller 16 may also be communicatively coupled to electrolyte source 10, gantry system 14, or both. Controller 16 may include any of a wide range of devices, including processors (e.g., one or more microprocessors, one or more application specific integrated circuits (ASICs), one or more field programmable gate arrays (FPGAs), or the like), one or more servers, one or more desktop computers, one or more notebook (i.e., laptop) computers, one or more cloud computing clusters, or the like.

Controller 16 may be configured to receive or include property information related to material 8. Property information may include any information that may be used to determine compositional properties of material 8. Property information may include, but is not limited to: dielectric constants, such as for constituent phases of material 8, compositions or constituents of material 8, and pore media of material 8; thicknesses, such as for portions of material 8 (e.g., a substrate, a coating layer, or the like); dielectric constants as a function of frequency, such as for constituent phases of material 8, compositions of material 8, and pore media of material 8; and the like. In some examples, controller 16 may determine and store property information related to dielectric constants and their variance with frequency. For example, controller 16 may include storage that stores property information in a database.

Controller 16 may be configured to generate a representation of material 8 as a function of portion of material 8. Controller 16 may be configured to cause user interface device 19 to output the representation. For example, the representation may be a spatial map that includes spatial compositional property information of the material, such as capacitance, permittivity, porosity, phase composition, layer composition, open/closed porosity, and the like. The spatial information may be stored, for example, in a database in controller 16 and any changes in the materials may be tracked.

Controller 16 may be configured to cause capacitance probe 4 to subject material 8 to one or more electric signals having selected frequencies. For example, controller 16 may send a control signal to capacitance probe 4 to cause capacitance probe 4 to generate a desired voltage with a desired frequency. In some examples, controller 16 may include voltage and frequency information in the control signal.

Figure 10:
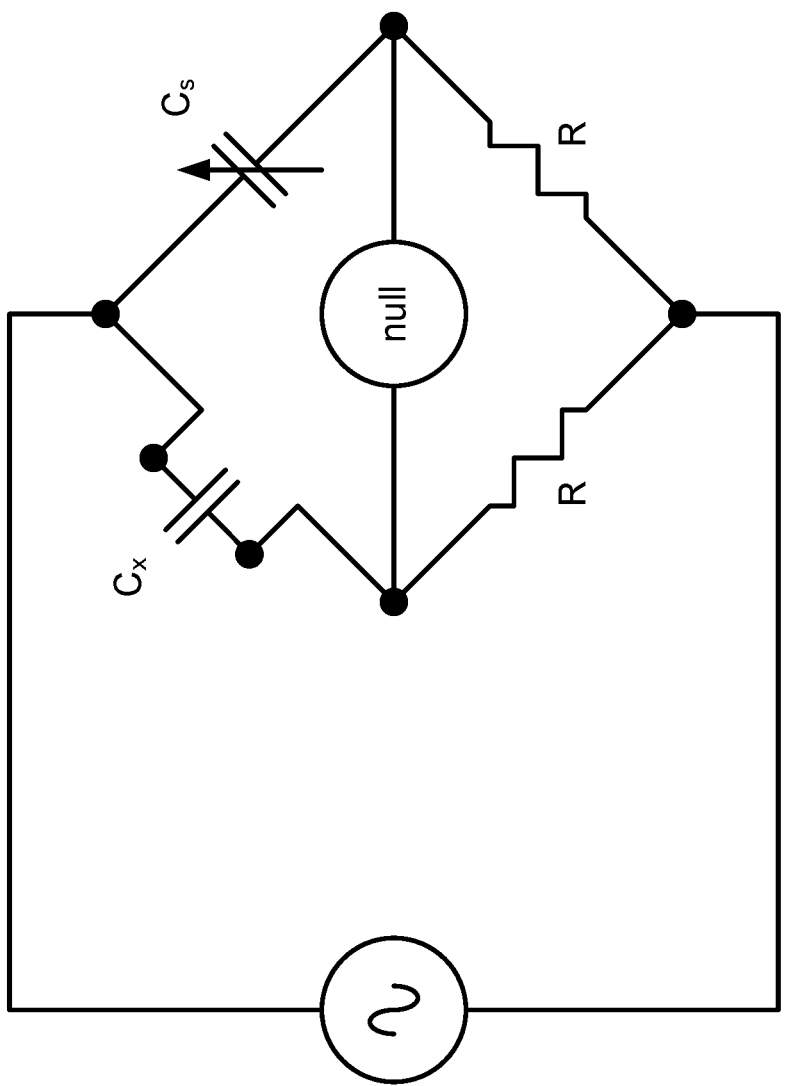
FIG. 10 is a schematic diagram of an exemplary bridging circuit used for determining a capacitance of a material.

Controller 16 may be configured to determine the capacitance of material 8. Controller 16 may receive feedback from capacitance probe 4 and determine a capacitance from the feedback. For example, capacitance probe 4 may detect a particular voltage change over a period of time and determine a capacitance from the voltage change and the period of time. An example circuit with which controller 16 may determine capacitance is shown in FIG. 10. FIG. 10 is a schematic diagram of an exemplary bridging circuit for determining a capacitance. Two known resistors, R, and a variable standard capacitance, $C_s$, may be used to determine an unknown capacitance, $C_x$, of material 8.

Controller 16 may be configured to determine a compositional property of material 8 based on capacitance. In some examples, controller 16 may be configured to determine a porosity of a material using a capacitance measurement. For example, controller 16 may receive dielectric coefficient information for material 8 (or constituents of material 8) and a pore medium, such as air, at a particular frequency. Controller 16 may determine a relative contribution of the material and pore medium to measured capacitance based on the measured capacitance, the dielectric information associated material 8 and the pore medium, the thickness of material 8, and the like. Controller 16 may correlate the relative contribution of the material and pore medium to porosity for the particular portion of material 8 being analyzed.

In some examples, controller 16 may be configured to determine a phase composition of a material having at least a first constituent and a second constituent of material 8. For example, controller 16 may receive dielectric information for two or more constituent phases of material 8 at one or more frequencies. Based on the capacitance and the dielectric information for the two or more constituent phases, controller 16 may determine a relative contribution of each of the two or more constituent phases to capacitance. Other constituents may include, but are not limited to, crystal structures, components, and other structures that may exhibit differences in dielectric constants throughout material 8. In some examples, the first and second constituents may be different compositions. For example, in a silicon carbide (SiC)/silicon (Si) material, the first constituent may include SiC and the second constituent may include Si. In some examples, the first and second constituents may be different phases of the same composition. For example, in a SiC/SiC CMC material, the first constituent phase may include α-SiC and the second constituent phase may include β-SiC.

In some examples, controller 16 may be configured to determine a closed and open porosity of a material. For example, controller 16 may determine a closed and open porosity of the material based on dielectric information of the material at a particular frequency, as well as a first capacitance of the material and pore medium and a second capacitance of the material and an electrolyte. Based on a difference between the first capacitance and the second capacitance, controller 16 may determine a relative contribution of open pores, corresponding to the first capacitance, and closed pores, corresponding to the second capacitance, of the material. Controller 16 may cause electrolyte source 10 to provide electrolyte solution to vessel 6. The electrolyte solution may permeate into open pores of one or more surfaces of material 8. For example, controller 16 may cause vessel 6 to fill with electrolyte solution, or controller 16 may selectively spray or immerse a surface with electrolyte solution. Controller 16 may allow for the electrolyte solution to substantially permeate and the second capacitance to reach steady state before determining the second capacitance measurement. For example, permeation may vary with time based on properties of the electrolyte solution and the open pores of material 8, such as viscosity of the electrolyte solution, size of the open pores, surface tension, lubricity, temperature, and the like. In examples having a highly viscous electrolyte solution, substantially all open pores may be filled when, for example, greater than 90% of open pore volumes has been filled. In some examples, substantially all open pores may be filled when a steady state capacitance has been reached.

In some examples, controller 16 may be configured to determine a coating composition of a coating having two or more layer materials. For example, controller 16 may determine a coating composition of the coating based on dielectric information of one or more layers of the coating, as well as a first capacitance of the underlying material and a second capacitance of the coating at one or more frequencies. Controller 16 may determine a difference between the first capacitance and the second capacitance and determine a relative contribution of each of the coatings based on that difference.

In some examples, controller 16 may be configured to determine a porosity of a coating. For example, controller 16 may determine a porosity of a coating based on dielectric information of an underlying material, the coating, and the coating pore medium at a particular frequency, as well as a first capacitance of the underlying material and a second capacitance of the coating. Controller 16 may determine a difference between the first capacitance and the second capacitance and determine a relative contribution of the coating and the coating pore medium based on that difference.

Controller 16 may be configured to perform any of the techniques above for one or more portions of material 8. Controller 16 may be configured to control gantry system 14 to reposition capacitance electrodes 18 of capacitance probe 4 to different portions of material 8. For example, controller 16 may cause capacitance probe 4 to subject material 8 to a first electric signal, determine a first capacitance of material 8, and determine a porosity of material 8 based on the first capacitance. Controller 16 may cause capacitance probe 4 to be positioned over a different portion of material 8, such as by controller gantry system 14. Controller 16 may then cause capacitance probe 4 to subject the different portion of material 8 to a second electric signal, determine a second capacitance of the different portion of material 8, and determine a porosity of the second portion of material 8 based on the second capacitance. Controller 16 may generate a representation of porosity of material 8 as a function of portion of material 8 and cause user interface device 19 to output the representation of porosity.

Further operation of controller 16 in system 2 will be described with reference to a controller communicatively coupled to a capacitance probe of FIGS. 2-9.

Figure 2:
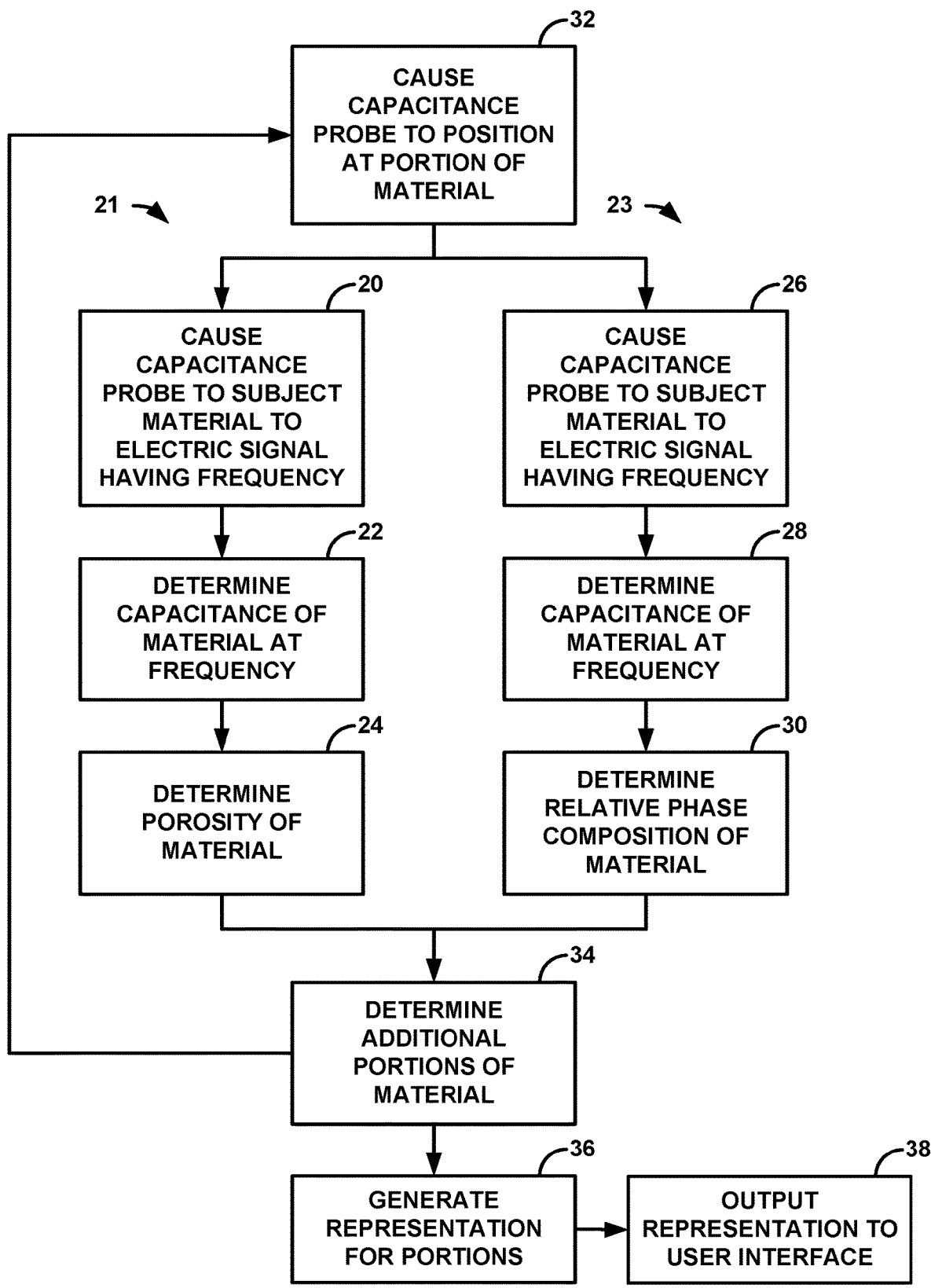
FIG. 2 is a flow diagram illustrating example techniques for determining porosity or phase composition of a material using capacitance.
Figure 3A:
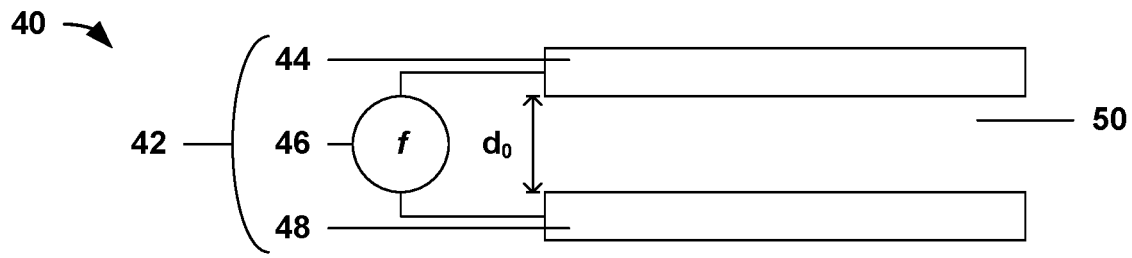
FIG. 3A is a diagram of an example system for measuring a capacitance of a capacitance probe.
Figure 3B:
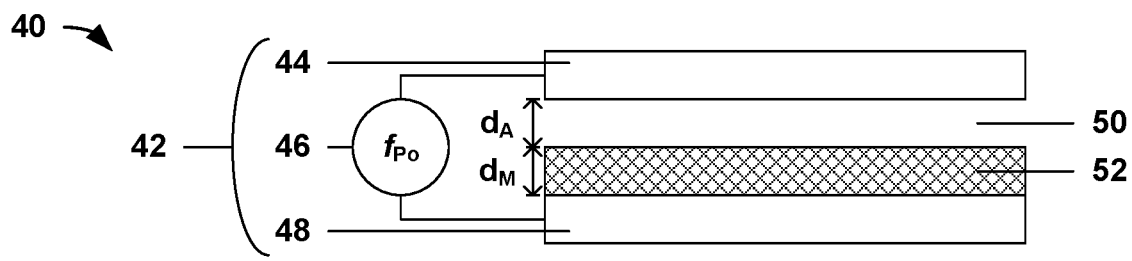
FIG. 3B is a diagram of an example system for measuring a capacitance of a material at a frequency for determining a porosity.
Figure 3C:
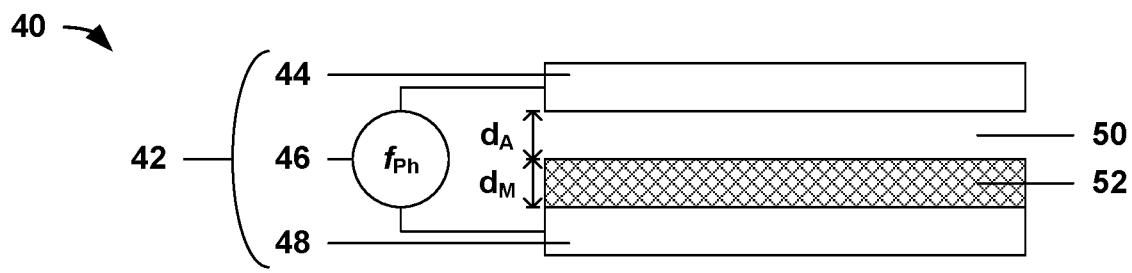
FIG. 3C is a diagram of an example system for measuring a capacitance of a material at a frequency for determining a phase composition.

In some examples, system 2 of FIG. 1 may determine a porosity or phase composition of material 8. For example, a material, such as material 8, may be used for a high stress part that requires a porosity of material 8 that is below a particular threshold. In another example, the same part may require a substantially homogenous distribution of crystal structures. FIG. 2 is a flow diagram illustrating example techniques for determining porosity (21), determining phase composition (23), or determining both, of material 8. The techniques of FIG. 2 will be described with concurrent reference to FIGS. 3A-3C, although one of ordinary skill will understand that the techniques of FIG. 2 may be performed by other systems that include more or fewer components, and that system 40 of FIGS. 3A-3C may perform other techniques. FIGS. 3A-3C are diagrams of an example system 40 for determining a porosity or phase composition of a material 52. Components of FIGS. 3A-3C may be substantially the same as similar components of FIG. 1. For example, system 2, capacitance probe 4, material 8, oscillator 12, capacitance electrodes 18A and 18B, and controller 16 may correspond to system 40, capacitance probe 42, material 52, oscillator 46, capacitance electrodes 44 and 48, and a controller (not shown), respectively.

FIG. 3A is a diagram of an example system for measuring a capacitance of a capacitance probe 42. Capacitance probe 42 includes oscillator 46 and capacitance electrodes 44, 48. Before positioning a material 52 in air gap 50, a controller (not shown), such as controller 16 of FIG. 1, may first determine a free permittivity of capacitance probe 42 and air gap 50 by using the capacitance of capacitance probe 42 and air gap 50. The free permittivity $\varepsilon_0$ represents the electric field permittivity caused by capacitance probe 42 and air gap 50 (e.g., air may have a dielectric constant of 1). The controller may cause capacitance probe 42 to subject air gap 50 to an electric signal. The controller may detect and determine a capacitance of the air gap 50. The capacitance may be represented by the following equation:

$$C_0 = \frac{\varepsilon_0 A}{d_0},$$

Where $C_0$ is the capacitance of capacitance probe 42 and air gap 50, $\varepsilon_0$ is the free permittivity, A is the area of each of capacitance electrodes 44, 48, and do is a distance between capacitance electrodes 44, 48 filled by air gap 50. The controller may determine the free permittivity $\varepsilon_0$ for capacitance probe 42 and air gap 50 based on the measured capacitance $C_0$ and the known values for A and do.

Referring back to FIG. 2, system 40 may use the techniques of FIG. 2 to determine a porosity of a portion of material 52 (21). The technique of FIG. 2 may include causing, by a controller, capacitance probe 42 to subject material 52 to an electric signal having a frequency $f_{Po}$ (20). In examples in which material 52 includes multiple constituent phases or compositions and system 40 is determining porosity of material 52, the frequency may be selected so that the constituent phases or compositions have substantially similar dielectric constants at the particular frequency. For example, at a frequency of about 2 GHz, alpha SiC and beta SiC may both have a dielectric constant of about 20. FIG. 3B is a diagram of system 40 for measuring a capacitance of material 52 at frequency $f_{Po}$ for determining a porosity of a portion of material 52. The portion of material 52 may be the portion between capacitance electrodes 44, 48. Material 52 may have a thickness $d_M$, while air gap 50 may have a new thickness $d_A$ due to space taken up by material 52. Material 52 may include a single constituent phase, or material 52 may include two or more constituent phases.

The technique of FIG. 2 may further include determining, by the controller, a capacitance of material 52 at the frequency $f_{Po}$ (22). The controller may measure an equivalent capacitance $C_{eq,Po}$ between capacitance electrodes 44, 48, including a capacitance $C_{Po}$ of material 52 at frequency $f_{Po}$ and a capacitance $C_A$ of air gap 50 at frequency $f_{Po}$. The equivalent capacitance $C_{eq,Po}$ of material 52 and air gap 50 may be represented by the following equation:

$$C_{eq,Po} = \left(\frac{1}{C_A} + \frac{1}{C_{Po}}\right)^{-1}$$

The capacitance $C_A$ of air gap 50 may be represented by the following equation:

$$C_A = \frac{\varepsilon_0 A}{d_0 - d_M},$$

while the capacitance $C_{Po}$ of material 52 at frequency $f_{Po}$ may be represented by the following equation:

$$C_{Po} = \frac{\varepsilon_{Po}\varepsilon_0 A}{d_M},$$

where $\varepsilon_{Po}$ is the relative permittivity of material 52 at frequency $f_{Po}$ and $d_M$ is the thickness of material 8. In some examples, the controller may use the $C_A$ determined in the first measurement, free permittivity $\varepsilon_0$, and equivalent capacitance $C_{eq,Po}$ to determine the capacitance $C_{Po}$ of material 52 at frequency $f_{Po}$ to determine $\varepsilon_{Po}$.

The technique of FIG. 2 may further include determining, by the controller, a porosity of material 52 (24). The controller may use any technique that determines a volume fraction of pore medium from capacitance $C_{Po}$ of material 52 at frequency $f_{Po}$. In some examples, the controller may determine a volume fraction of material 52 and pore medium by evaluating the relative permittivity $\varepsilon_{Po}$ of material 52 at frequency $f_{Po}$ with respect to the dielectric constant of material 52 and the dielectric constant of air. For example, the volume fraction of material 8 and air may be represented by the following equations:

$$\varepsilon_R = \varepsilon_M V_M + \varepsilon_A V_A \text{ and } V_M + V_A = 1,$$

where $\varepsilon_M$ is the relative permittivity of non-porous material 8, $V_M$ is the volume fraction of nonporous material 8, $C_A$ is the relative permittivity of air, and $V_A$ is the volume fraction of air. If the relative permittivity $\varepsilon_{Po}$ of SiC material 52 at frequency $f_{Po}$ is 19.5, the relative permittivity $C_A$ of air is 1, and the relative permittivity $\varepsilon_M$ of nonporous SiC is 20, then the porosity of material 52 may be about 7%.

Additionally or alternatively, system 40 may use the techniques of FIG. 2 to determine a phase composition of material 52 (23) having at least a first constituent phase and a second constituent phase. The technique of FIG. 2 may include causing, by the controller, capacitance probe 42 to subject material 52 to an electric signal having a frequency $f_{Ph}$ (26). The frequency $f_{Ph}$ may be selected so that the first constituent phase and the second constituent phase of material 52 have substantially different dielectric constants at the frequency $f_{Ph}$. For example, at a frequency of 1 GHz, alpha SiC may have a dielectric constant of about 20, while beta SiC may have a dielectric constant of about 35. FIG. 3C is a diagram of system 40 for measuring a capacitance of material 52 at a frequency $f_{Ph}$ for determining a phase composition of material 52.

The technique of FIG. 2 may further include determining, by the controller, a capacitance of material 52 at frequency $f_{Ph}$ (28). The controller may measure an equivalent capacitance $C_{eq,Ph}$ between capacitance electrodes 44, 48, including a capacitance $C_{Ph}$ of material 52 at frequency $f_{Ph}$ and a capacitance $C_A$ of air gap 50 at frequency $f_{Po}$. The equivalent capacitance $C_{eq,Ph}$ may be represented by the following equation:

$$C_{eq,Ph} = \left(\frac{1}{C_A} + \frac{1}{C_{Ph}}\right)^{-1}$$

The capacitance $C_{Ph}$ of material 52 at frequency $f_{Ph}$ may be represented by the following equation:

$$C_{Ph} = \frac{\varepsilon_{Ph}\varepsilon_0 A}{d_M},$$

where $\varepsilon_{Ph}$ is the relative permittivity of material 52 at frequency $f_{Ph}$. In some examples, the controller may use the $C_A$ determined in the first measurement, free permittivity $\varepsilon_0$, and the equivalent capacitance $C_{eq,Ph}$, to determine the capacitance $C_{Ph}$ of material 52 at frequency $f_{Ph}$ to determine the relative permittivity $\varepsilon_{Ph}$ of material 52 at frequency $f_{Ph}$.

The technique of FIG. 2 may further include determining, by the controller, a relative phase composition of material 52 (30). In some examples, the controller may determine a contribution of each of the first constituent phase dielectric constant and the second constituent phase dielectric constant to the relative permittivity $\varepsilon_{Ph}$ of material 52 at frequency $f_{Ph}$. For example, the volume fraction of the first and second constituent phases of material 52 may be represented by the following equations:

$$\varepsilon_R = \varepsilon_{M,1} V_{M,1} + \varepsilon_{M,2} V_{M,2} \text{ and } V_{M,1} + V_{M,2} = 1,$$

where $\varepsilon_{M,1}$ is the relative permittivity of the first constituent phase, $V_{M,1}$ is the volume fraction of the first constituent phase, $\varepsilon_{M,2}$ is the relative permittivity of the second constituent phase, and $V_{M,2}$ is the volume fraction of the second constituent phase. For example, if the relative permittivity $\varepsilon_{Ph}$ of SiC material 52 at frequency $f_{Ph}$ is 25, the dielectric constant of alpha SiC is 20, and the dielectric constant of beta SiC is 35, then the relative phase composition at the particular portion of material 52 based on volume fraction may be ⅔ alpha SiC and ⅓ beta SiC. Alternatively, a volumetric ratio of the volume fractions of the first constituent phase and the second constituent phase may be used.

The technique of FIG. 2 may further include causing, by the controller, capacitance probe 42 to be positioned over a different portion of material 52. Before steps 20 or 26 discussed above, the controller may cause capacitance probe 42 to be positioned over a portion of material 52 (32). After determining a porosity or relative phase composition of material 52, as in steps 24 and 30, the controller may determine additional portions of material 52 for which to determine a porosity or relative phase composition (34). The controller may cause capacitance probe 42 to be positioned over a different portion of material 52 (32). The controller may generate a representation of a porosity, a relative phase composition, or both, as a function of portion of material 52 (36). The controller may cause a user interface device to output the representation of the porosity, the relative phase composition, or both (38).

By using the techniques of FIG. 2, a system 2 may relatively quickly and relatively inexpensively determine a porosity or phase composition of a material. For example, an x-ray or other radiographic scan of the material may be costly and require a significant amount of time to complete. In contrast, the techniques of FIG. 2 may allow for real-time scanning of an article that includes the material to generate, for example, a composition map of porosity, phase composition, or other property for the article. The techniques of FIG. 2 may be feasible for a wide range of articles whose alternative costs of performance evaluation, such as quality control, may be prohibitive.

Figure 4:
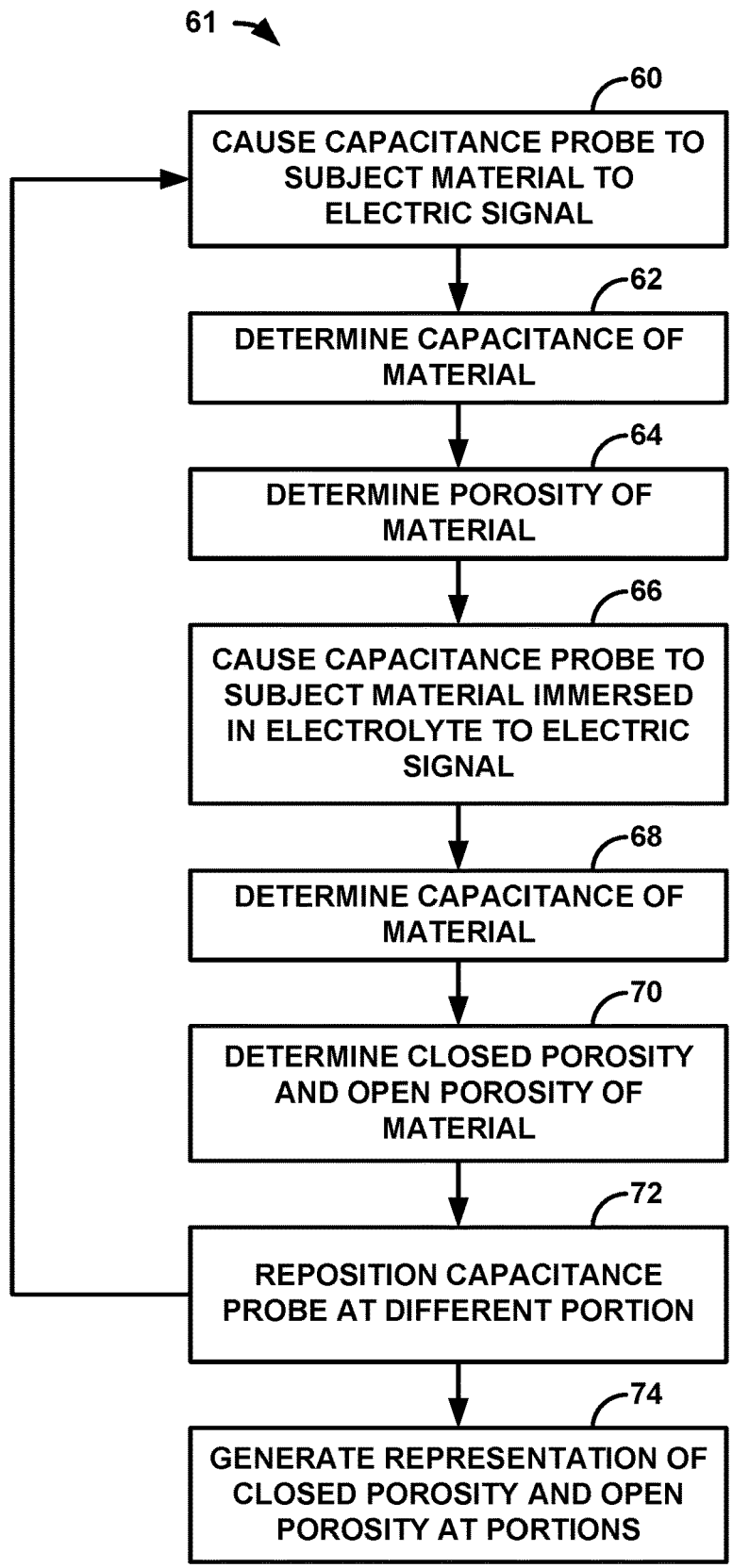
FIG. 4 is a flow diagram illustrating an example technique for determining open or closed porosity of a material using capacitance.
Figure 5A:
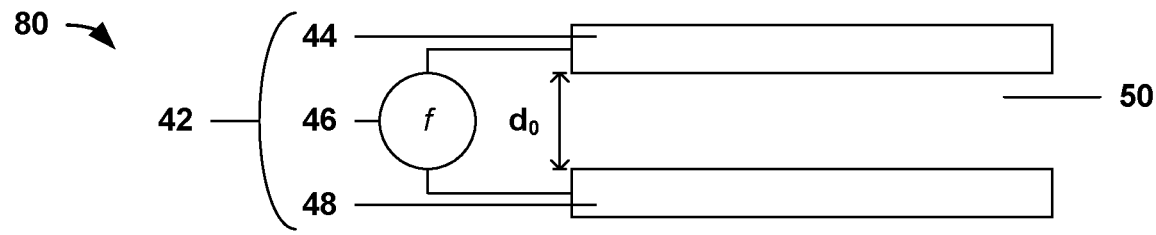
FIG. 5A is a diagram of an example system for measuring a capacitance of a capacitance probe.
Figure 5B:
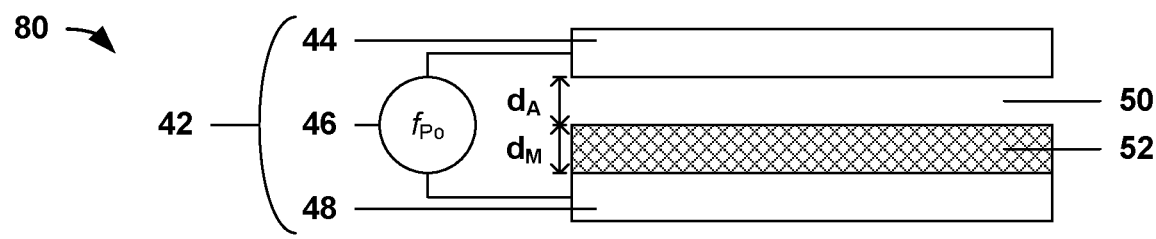
FIG. 5B is a diagram of an example system for measuring a capacitance of a material at a frequency for determining a porosity.
Figure 5C:
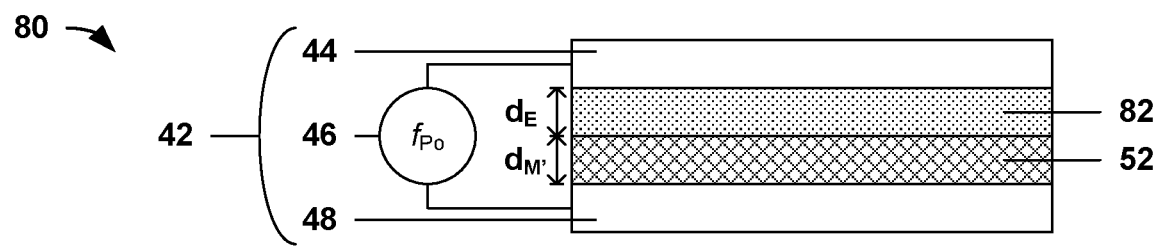
FIG. 5C is a diagram of an example system for measuring a capacitance of a material immersed in electrolyte solution at a frequency for determining a porosity.

In addition to determining porosity of material 52, the techniques discussed herein may be used to determine an open and closed porosity of material 52. For example, a material used in fluid environments may preferably have a low permeability that corresponds to a low fraction of open pores to closed pores, or a barrier coating may include a low fraction of open porosity to reduce a permeability of the coating to fluids. FIG. 4 is a flow diagram illustrating an example technique for determining open and closed porosity of a material using capacitance (61). The technique of FIG. 4 will be described with concurrent reference to FIGS. 5A-5C and previously described FIG. 2, although one of ordinary skill will understand that the technique of FIG. 4 may be performed by other systems that include more or fewer components, and that system 2 may perform other techniques. FIGS. 5A-5C are diagrams of an example system 80 for determining an open and closed porosity of material 52 using capacitance. Components of FIGS. 5A-5C may be substantially the same as similar components of FIG. 1. For example, system 2, capacitance probe 4, material 8, oscillator 12, capacitance electrodes 18A and 18B, and controller 16 may correspond to system 40, capacitance probe 42, material 52, oscillator 46, capacitance electrodes 44 and 48, and a controller (not shown), respectively.

FIG. 5A is a diagram of system 80 for measuring a capacitance of a capacitance probe 42, which may be operably similar to FIG. 3A described above. Capacitance probe 42 includes oscillator 46 and capacitance electrodes 44, 48. Before positioning a material 52 in air gap 50, a controller (not shown), such as controller 16 of FIG. 1, may first determine a free permittivity of capacitance probe 42 and air gap 50 by using the capacitance of capacitance probe 42 and air gap 50. The free permittivity $\varepsilon_0$ represents the electric field permittivity caused by capacitance probe 42 and air gap 50 (e.g., air may have a dielectric constant of 1). The controller may cause capacitance probe 42 to subject air gap 50 to an electric signal. The controller may detect and determine a capacitance of the air gap 50. The capacitance may be represented by the following equation:

$$C_0 = \frac{\varepsilon_0 A}{d_0},$$

Where $C_0$ is the capacitance of capacitance probe 42 and air gap 50, $\varepsilon_0$ is the free permittivity, A is the area of each of capacitance electrodes 44, 48, and $d_0$ is a distance between capacitance electrodes 44, 48 filled by air gap 50. The controller may determine the free permittivity $\varepsilon_0$ for capacitance probe 42 and air gap 50 based on the measured capacitance $C_0$ and the known values for A and $d_0$.

Referring back to FIG. 4, system 80 may use the techniques of FIG. 4 to determine an open and closed porosity of a portion of material 52 using capacitance (61). The technique of FIG. 4 may include causing, by the controller, capacitance probe 42 to subject material 52 to an electric signal having a frequency $f_{Po}$ (60). In examples in which material 52 includes multiple constituent phases or compositions, the frequency may be selected so that the constituent phases or compositions have substantially similar dielectric constants at the particular frequency.

FIG. 5B is a diagram of system 80 for measuring a capacitance of material 52 at a frequency for determining a porosity of material 52. The portion of the material 52 may be the portion between capacitance electrodes 44, 48. Material 52 may have a thickness $d_M$, while air gap 50 may have a new thickness $d_A$ due to space taken up by material 52. Material 52 may include a single constituent phase, or material 52 may include two or more constituent phases.

The technique of FIG. 4 may further include determining, by the controller, a capacitance $C_{Po}$ of material 52 at frequency $f_{Po}$, such as described in step 22 of FIG. 2 (62). The controller may measure an equivalent capacitance $C_{eq,Po}$ between capacitance electrodes 44, 48, including a capacitance $C_{Po}$ of material 52 at frequency $f_{Po}$ and a capacitance $C_A$ of air gap 50. The equivalent capacitance $C_{eq,Po}$ may be represented by the following equation:

$$C_{eq,Po} = \left(\frac{1}{C_A} + \frac{1}{C_{Po}}\right)^{-1}$$

The capacitance $C_A$ of air gap 50 may be represented by the following equation:

$$C_A = \frac{\varepsilon_0 A}{d_0 - d_M},$$

while the capacitance $C_{Po}$ of material 52 may be represented by the following equation:

$$C_{Po} = \frac{\varepsilon_{Po} \varepsilon_0 A}{d_M},$$

where $\varepsilon_{Po}$ is the relative permittivity of material 52 at frequency $f_{Po}$ and $d_M$ is the thickness of material 52. In some examples, the controller may use $C_A$ determined in the first measurement, free permittivity $\varepsilon_0$, and equivalent capacitance $C_{eq,Po}$ to determine the capacitance $C_{Po}$ of material 52 at frequency $f_{Po}$ to determine $\varepsilon_{Po}$.

The technique of FIG. 4 may further include determining, by the controller, a porosity of material 52 (64). The controller may use any technique that determines a property fraction of pore medium from capacitance of material 52. In some examples, the controller may determine a volume fraction of material 52 and pore medium by evaluating the relative permittivity $\varepsilon_{Po}$ with respect to a dielectric constant of the pore medium and a dielectric constant of material 52.

The technique of FIG. 4 may include causing, by the controller, an electrolyte source to deposit electrolyte solution to at least one surface of material 52. In some examples, the controller may cause the electrolyte source to immerse material 52 in the electrolyte solution. In other examples, the controller may cause the electrolyte source to deposit electrolyte solution to a top surface of material 52. Electrolyte solution may substantially fill open pores of a portion of material 52, such as greater than 90% of open pores. Electrolyte solution 52 may also replace air gaps, such as air gap 50, between capacitive electrodes 44, 48.

The technique of FIG. 4 may include causing, by the controller, capacitance probe 42 to subject material 52, immersed in electrolyte solution, to an electric signal having the frequency $f_{Po}$ (64). FIG. 5C is a diagram of system 80 for measuring a capacitance of material 52 immersed in electrolyte solution at frequency $f_{Po}$ for determining a porosity. Capacitance probe 42 may have material 52 and electrolyte layer 82 between capacitance electrodes 44, 48. Electrolyte layer 82 may have a thickness $D_E$ that replaces air gap 50. Material 52 may have a new thickness $d_{M'}$ due to immersion of electrolyte into material 52.

The technique of FIG. 4 may further include determining, by the controller, a capacitance of material 52, immersed in electrolyte solution, at frequency $f_{Po}$ (66). The controller may measure an equivalent capacitance $C_{eq,CP}$ between capacitance electrodes 44, 48, including a closed pore capacitance $C_{CP}$ of material 52 at frequency $f_{Po}$ and a capacitance $C_E$ of electrolyte layer 82. The equivalent capacitance $C_{eq,CP}$ may be represented by the following equation:

$$C_{eq,CP} = \left(\frac{1}{C_E} + \frac{1}{C_{CP}}\right)^{-1}$$

The capacitance $C_E$ of electrolyte layer 82 may be negligible, as a permittivity value of the electrolyte layer may be very low. The closed pore capacitance $C_{CP}$ of material 52 may be represented by the following equation:

$$C_{CP} = \frac{\varepsilon_{CP} \varepsilon_0 A}{d_{M'}},$$

where $\varepsilon_{CP}$ is the closed pore permittivity of material 52 at frequency $f_{Po}$. Due to the negligible permittivity of the electrolyte layer 82, the equivalent capacitance $C_{eq,CP}$ may be equal to the closed pore capacitance $C_{CP}$ of material 52.

The technique of FIG. 4 may further include determining, by the controller, a closed porosity and an open porosity of material 52 (68). In some examples, the controller may determine a closed porosity and an open pore porosity based on the closed pore permittivity cu of material 52 at frequency $f_{P_o}$ determined above by using multiple measurements—in air and in electrolyte. For example, if the relative permittivity EN of SiC material 52 in air at frequency $f_{P_o}$ is 19.5, the relative permittivity $\varepsilon_{CP}$ of closed pore SiC material 52 at frequency $f_{P_o}$ is 19, the dielectric constant of air is 1, and the permittivity of nonporous SiC is 20, then the closed porosity of material 52 may be about 3.5% and the open porosity of material 52 may be about 3.5%.

The technique of FIG. 4 may further include causing, by the controller, capacitance probe 42 to be positioned over a different portion of material 52. Controller 16 may reposition capacitance probe 4 at a different portion of material 52 (72). Before step 60 discussed above, the controller may cause capacitance probe 42 to be positioned over a portion of material 52. After determining an open porosity and a closed porosity of material 52, as in step 70, the controller may determine additional portions of material 52 for which to determine an open or closed porosity. The controller may cause capacitance probe 42 to be positioned over a different portion of material 52. The controller may generate a representation of an open and closed porosity as a function of portion of material 52 (74). The controller may cause a user interface device to output the representation of the open and closed porosity.

By using the technique of FIG. 4, system 2 may quickly and inexpensively determine an open and closed porosity of a material. For example, rather than use expensive x-ray tomography, the technique of FIG. 4 may use a relatively inexpensive capacitance probe to determine the open and closed porosity of a material at various locations. As another example, rather than use more immersive gravimetric methods involving submersion and weighing, the technique of FIG. 4 may allow for targeted application of electrolyte solution and analysis for specific portions of a material.

Figure 6:
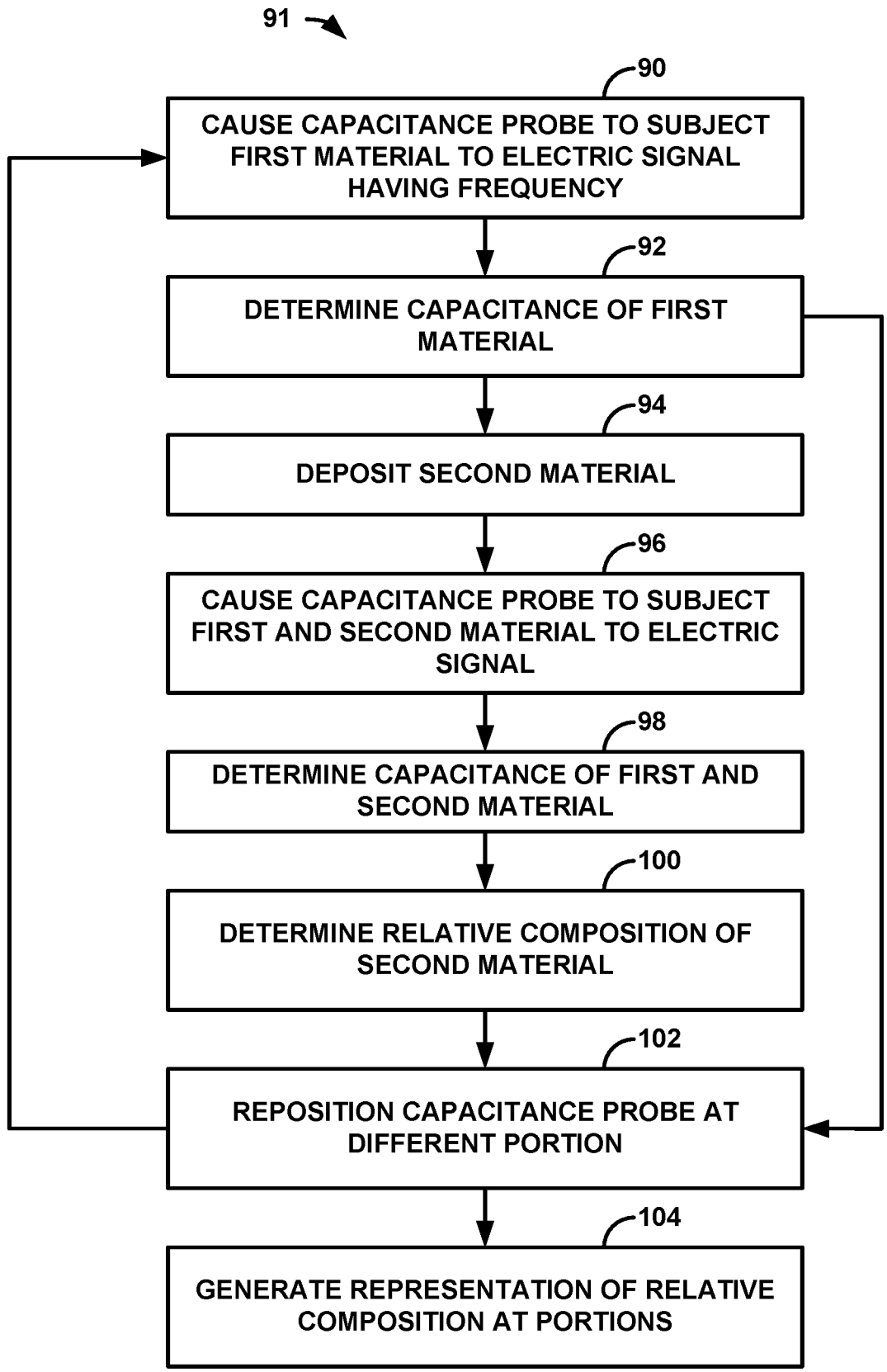
FIG. 6 is a flow diagram illustrating an example technique for determining phase or material composition of a second material on a first material using capacitance.
Figure 7A:
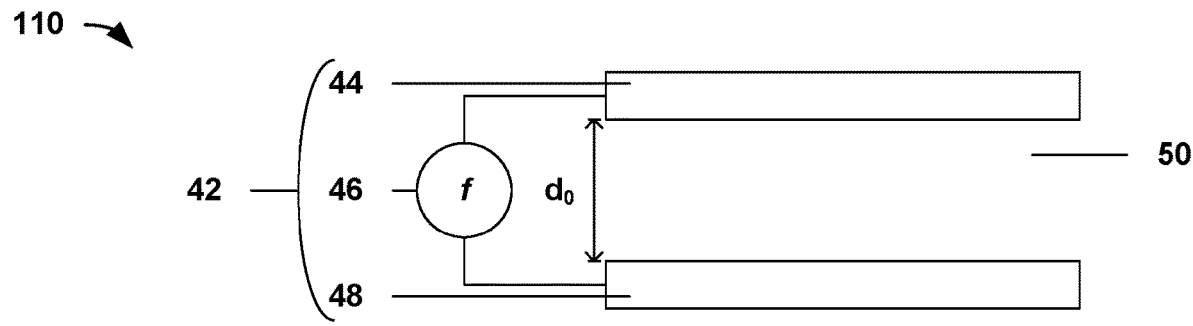
FIG. 7A is a diagram of an example system for measuring a capacitance of a capacitance probe.
Figure 7B:
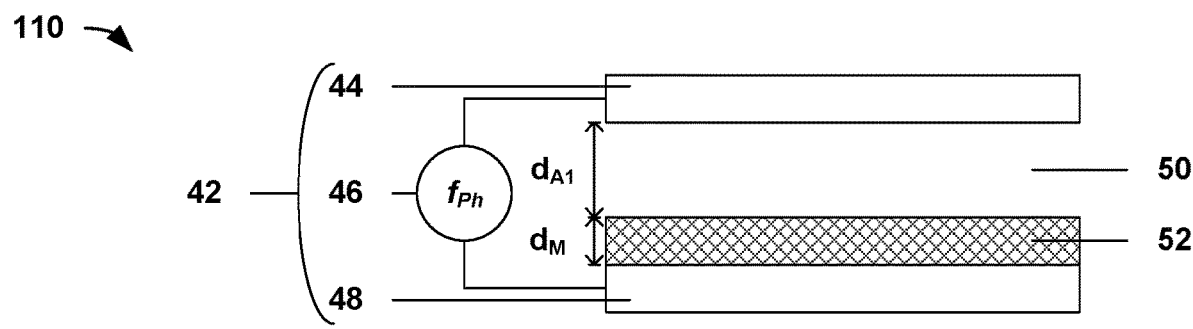
FIG. 7B is a diagram of an example system for measuring a capacitance of a material at a frequency for determining a phase or layer composition.
Figure 7C:
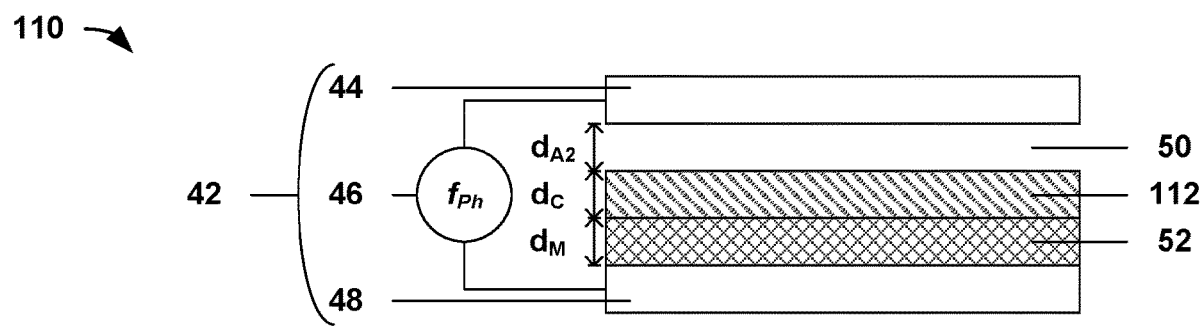
FIG. 7C is a diagram of an example system for measuring a capacitance of a first material and a second material at a frequency for determining a phase composition.

In some examples, system 2 of FIG. 1 may be used to determine a phase or layer composition of material 8 having a coating or other layer. For example, material 8 may include a substrate and an environmental barrier coating on the substrate to protect substrate from chemical attack by environmental species, such as water vapor or oxygen. System 2 may be used to evaluate the coating for uniformity, to determine whether a sufficiently thick coating has been applied to the substrate, or to determine whether the coating includes an acceptable level of porosity, open porosity, or closed porosity. FIG. 6 is a flow diagram illustrating an example technique for determining phase or layer composition of a second material, such as a coating, on a first material using capacitance (91). The techniques of FIG. 6 will be described with concurrent reference to FIGS. 7A-7C, although one of ordinary skill will understand that the techniques of FIG. 6 may be performed by other systems that include more or fewer components, and that system 2 may perform other techniques. FIGS. 7A-7C are diagrams of an example system 110 for determining a phase or layer composition of coating 112. Components of FIGS. 7A-7C may be equivalent to similar components of FIG. 1. For example, system 2, capacitance probe 4, material 8, oscillator 12, capacitance electrodes 18A and 18B, and controller 16 may correspond to system 40, capacitance probe 42, material 52, oscillator 46, capacitance electrodes 44 and 48, and a controller (not shown), respectively.

FIG. 7A is a diagram of system 110 for measuring a capacitance of capacitance probe 42. System 110 may include capacitance probe 42 having oscillator 46 and capacitance electrodes 44, 48. Before positioning a material 52 in air gap 50, a controller (not shown), such as controller 16 of FIG. 1, may first determine a free permittivity of capacitance probe 42 and air gap 50 by using the capacitance of capacitance probe 42 and air gap 50. The controller may cause capacitance probe 42 to subject air gap 50 to an electric signal. The controller may detect and determine a capacitance of the air gap 50. The capacitance may be represented by the following equation:

$$C_0 = \frac{\varepsilon_0 A}{d_0},$$

Where $C_0$ is the capacitance of capacitance probe 42 and air gap 50, $\varepsilon_0$ is the free permittivity, A is the area of capacitance electrodes 44, 48, and do is a distance between capacitance electrodes 44, 48 filled by air gap 50. The controller may determine the permittivity of free space $\varepsilon_0$ for capacitance probe 42 and air gap 50.

System 110 may use the techniques of FIG. 6 to determine a phase or layer composition of second material 112 (91) having at least a first constituent phase or layer and a second constituent phase or layer.

The technique of FIG. 6 may include causing, by the controller, capacitance probe 42 to subject material 52 to an electric signal having a frequency $f_{Ph}$ (90). The frequency $f_{Ph}$ may be selected so that the first constituent phase or layer and the second constituent phase or layer have substantially different dielectric constants at the frequency $f_{Ph}$. FIG. 7B is a diagram of system 110 for measuring a capacitance of material 52 at frequency $f_{Ph}$ for determining a phase or layer composition. Air gap 50 may have a new distance $d_{A1}$ due to space taken up by material 52.

The technique of FIG. 6 may further include determining, by the controller, a capacitance $C_{Ph}$ of material 52 at frequency $f_{Ph}$, such as in step 28 of FIG. 2 (92). The controller may measure an equivalent capacitance $C_{eq,Ph}$ between capacitance electrodes 44, 48, including a capacitance $C_{Ph}$ of material 52 at frequency $f_{Ph}$ and a capacitance $C_{A1}$ of air gap 50. The equivalent capacitance $C_{eq,Ph}$ may be represented by the following equation:

$$C_{eq,Ph} = \left(\frac{1}{C_A} + \frac{1}{C_{Ph}}\right)^{-1}$$

The capacitance $C_{A1}$ of air gap 50 may be represented by the following equation:

$$C_{A1} = \frac{\varepsilon_0 A}{d_0 - d_M},$$

while the capacitance $C_{Ph}$ of material 52 at frequency $f_{Ph}$ may be represented by the following equation:

$$C_{Ph} = \frac{\varepsilon_{Ph}\varepsilon_0 A}{d_M},$$

where $\varepsilon_{Ph}$ is the relative permittivity of material 52 at frequency $f_{Ph}$. In some examples, the controller may use the $C_A$ determined in the first measurement, the free permittivity $\varepsilon_0$, and the equivalent capacitance $C_{eq,Ph}$, at frequency $f_{Ph}$ to determine the capacitance $C_{Ph}$ and/or relative permittivity $\varepsilon_{Ph}$ of material 52 at frequency $f_{Ph}$.

In some examples, the technique of FIG. 6 may further include determining, by the controller, a relative phase composition of material 52 (not shown). In some examples, the controller may determine a contribution of each of the first constituent phase dielectric constant and the second constituent phase dielectric constant to the relative permittivity $\varepsilon_{Ph}$ of material 52 at frequency $f_{Ph}$.

The technique of FIG. 6 may further include depositing a second material, such as coating 112, on material 52 (not shown). For example, an environmental barrier coating may be applied to material 52 to protect material 52 from deterioration. In some examples, coating 112 may have more than one layer deposited. For examples of coating 112, see material 8 of FIG. 1.

The technique of FIG. 6 may include causing, by the controller, capacitance probe 42 to subject material 52 and coating 112 to an electric signal having a frequency $f_{Ph}$ (96). In some examples, the frequency $f_{Ph}$ may be selected so that the first constituent phase or layer and the second constituent phase or layer have substantially different dielectric constants at the frequency $f_{Ph}$. FIG. 7C is a diagram of system 110 for measuring a capacitance of a first material and a second material at a frequency $f_{Ph}$ for determining a phase composition of coating 112. Air gap 50 may have a new distance $d_{A2}$ due to space taken up by material 52 and coating 112.

The technique of FIG. 6 may further include determining, by the controller, a capacitance of material 52 at frequency $f_{Ph}$ (98). The controller may measure an equivalent capacitance $C_{eq,CoPh}$ between capacitance electrodes 44, 48, including a capacitance $C_{Ph}$ of material 52 at frequency $f_{Ph}$, a capacitance $C_{CoPh}$ of coating 112 at frequency $f_{Ph}$, and a capacitance $C_{A2}$ of air gap 50. The equivalent capacitance $C_{eq,CoPh}$ may be represented by the following equation:

$$C_{eq,CoPh} = \left(\frac{1}{C_{A2}} + \frac{1}{C_{Ph}} + \frac{1}{C_{CoPh}}\right)^{-1},$$

where the capacitance $C_{A2}$ of air gap 50 may be represented by the following equation:

$$C_{A2} = \frac{\varepsilon_0 A}{d_0 - d_C - d_M},$$

where $d_C$ is a thickness of the coating 112. The capacitance $C_{CoPh}$ of coating 112 at frequency $f_{Ph}$ may be represented by the following equation:

$$C_{CoPh} = \frac{\varepsilon_{CoPh} \varepsilon_0 A}{d_C},$$

where $\varepsilon_{CoPh}$ is the relative permittivity of coating 112 at frequency $f_{Ph}$. In some examples, the controller may use the free permittivity $\varepsilon_0$, the equivalent capacitance $C_{eq,CoPh}$, and the capacitance $C_{Ph}$ of material 52 at frequency $f_{Ph}$, to determine the capacitance $C_{CoPh}$ of coating 112 at frequency $f_{Ph}$.

The technique of FIG. 6 may further include determining, by the controller, a relative composition of coating 112, such as a relative constituent or layer composition (100). In other examples having a first and a second constituent phase, the controller may determine a volume fraction of each of a first constituent phase dielectric constant and a second constituent phase dielectric constant to the relative permittivity $\varepsilon_{CoPh}$ of coating 112 at frequency $f_{Ph}$. For example, the volume fraction of the first and second constituents of coating 112 may be represented by the following equations:

$$\varepsilon_R = \varepsilon_{M,1} V_{M,1} + \varepsilon_{M,2} V_{M,2} \text{ and } V_{M,1} + V_{M,2} = 1,$$

where $\varepsilon_{M,1}$ is the relative permittivity of the first constituent, $V_{M,1}$ is the volume fraction of the first constituent, $\varepsilon_{M,2}$ is the relative permittivity of the second constituent, and $V_{M,2}$ is the volume fraction of the second constituent. In others examples having two layers in coating 112, the controller may determine a relative composition of each of a first layer dielectric constant and a second layer dielectric constant to the relative permittivity $\varepsilon_{CoPh}$ of coating 112 at frequency $f_{Ph}$ to determine, for example, a relative thickness of each layer or a uniformity of coverage of each layer across material 52.

In some examples, the controller may determine a thickness $d_C$ of coating 112 based on a known relative permittivity $C_{CoPh}$ of coating 112. For example, the controller may determine whether the thickness $d_C$ of coating 112 is uniform over an article. If a capacitance $C_{CoPh}$ of coating 112 is outside a threshold, indicating a coating that is too thick or thin, coating 112 may be rejected.

The technique of FIG. 6 may further include causing, by the controller, capacitance probe 42 to be positioned over a different portion of material 52. Controller 16 may reposition capacitance probe 4 at a different portion of material 52 (102). Before step 90 discussed above, the controller may cause capacitance probe 42 to be positioned over a portion of material 52. After determining relative composition of coating 112, as in step 100, the controller may determine additional portions of coating 112 for which to determine a relative composition. The controller may cause capacitance probe 42 to be positioned over a different portion of coating 112. The controller may generate a representation of a relative composition as a function of portion of coating 112 (104). The controller may cause a user interface device to output the representation of the relative composition.

Figure 8:
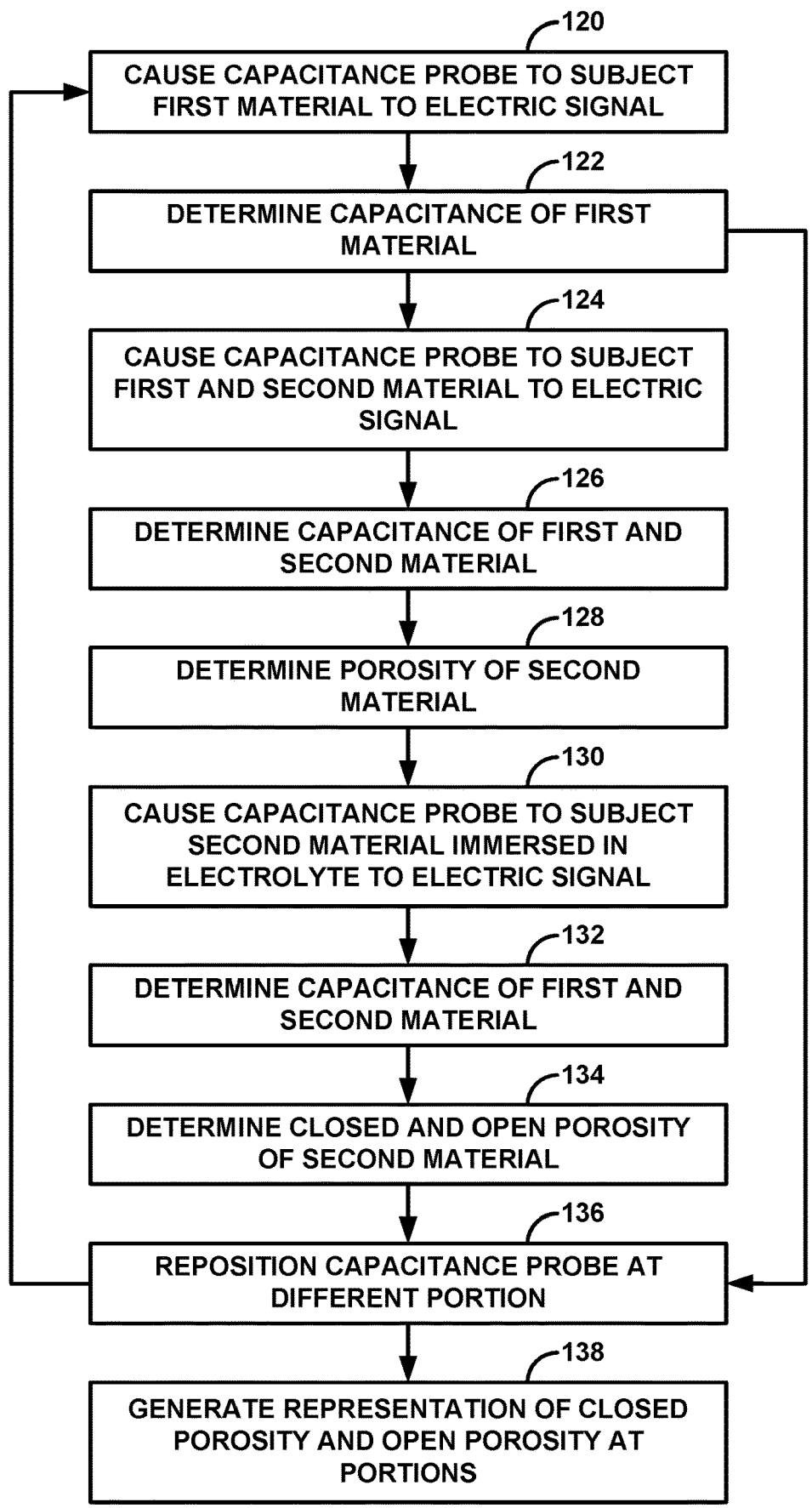
FIG. 8 is a flow diagram illustrating an example technique for determining open or closed porosity of a second material on a first material using capacitance.

In addition to or instead of determining a phase or layer composition of a second material on a first material, system 2 of FIG. 1 may also determine a porosity, open porosity, and closed porosity of the second material. For example, a coating used as an environmental barrier coating may have certain requirements for porosity to restrict permeation of gases through the environmental barrier coating to the underlying substrate. FIG. 8 is a flow diagram illustrating an example technique for determining open or closed porosity of a second material on a first material using capacitance. (121). The technique of FIG. 8 will be described with concurrent reference to FIGS. 9A-9D, although one of ordinary skill will understand that the technique of FIG. 8 may be performed by other systems that include more or fewer components, and that system 2 may perform other techniques. FIGS. 9A-9D are diagrams of an example system 140 for determining a porosity, an open porosity, and/or a closed porosity of a coating 112 on material 52. Components of FIGS. 9A-9D may be equivalent to similar components of FIG. 1. For example, system 2, capacitance probe 4, material 8, oscillator 12, capacitance electrodes 18A and 18B, and controller 16 may correspond to system 40, capacitance probe 42, material 52, oscillator 46, capacitance electrodes 44 and 48, and a controller (not shown), respectively.

Figure 9A:
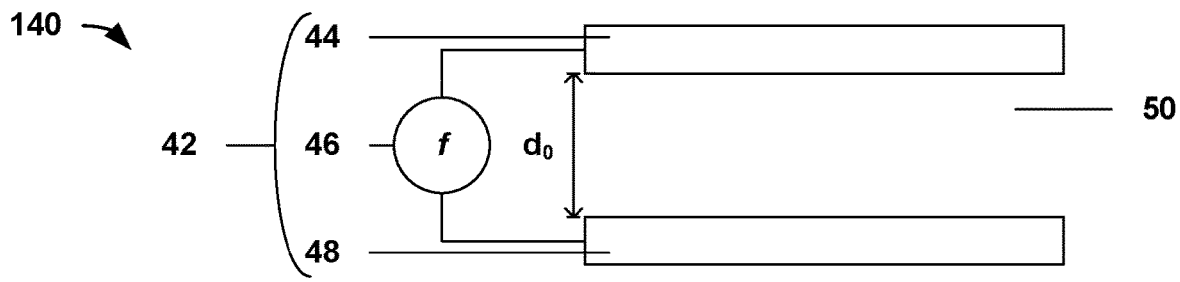
FIG. 9A is a diagram of an example system for measuring a capacitance of a capacitance probe.

FIG. 9A is a diagram of system 140 for measuring a capacitance of capacitance probe 42. Capacitance probe 42 includes oscillator 46 and capacitance electrodes 44, 48. Before positioning a material 52 in air gap 50, a controller (not shown), such as controller 16 of FIG. 1, may first determine a free permittivity of capacitance probe 42 and air gap 50 by using the capacitance of capacitance probe 42 and air gap 50. The free permittivity $\varepsilon_0$ represents the electric field permittivity caused by capacitance probe 42 and air gap 50 (e.g., air may have a dielectric constant of 1). The controller may cause capacitance probe 42 to subject air gap 50 to an electric signal. The controller may detect and determine a capacitance of the air gap 50. The capacitance may be represented by the following equation:

$$C_0 = \frac{\varepsilon_0 A}{d_0},$$

Where $C_0$ is the capacitance of capacitance probe 42 and air gap 50, $\varepsilon_0$ is the free permittivity, A is the area of capacitance electrodes 44, 48, and do is a distance between capacitance electrodes 44, 48 filled by air gap 50. The controller may determine the free permittivity $\varepsilon_0$ for capacitance probe 42 and air gap 50.

System 140 may use the techniques of FIG. 8 to determine a porosity of a portion of coating 112 (121). The technique of FIG. 8 may include causing, by the controller, capacitance probe 42 to subject material 52 to an electric signal having a frequency $f_{Po}$ (120). The frequency $f_{Ph}$ may be selected so that the first constituent phase or layer and the second constituent phase or layer have substantially different dielectric constants at the frequency $f_{Ph}$.

Figure 9B:
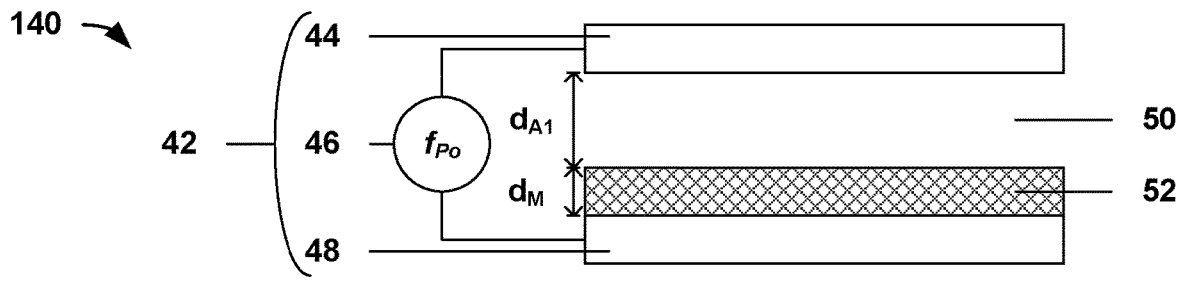
FIG. 9B is a diagram of an example system for measuring a capacitance of a material at a frequency for determining a porosity.

FIG. 9B is a diagram system 140 for measuring a capacitance of material 52 at frequency $f_{Po}$ for determining a porosity. The portion of the material 52 may be the portion between capacitance electrodes 44, 48. Material 52 may have a thickness $d_M$, while air gap 50 may have a new thickness $d_{A1}$ due to space taken up by material 52. Material 52 may have a single constituent phase, or material 52 may have two or more constituent phases.

The technique of FIG. 8 may further include determining, by the controller, a capacitance of material 52 at the frequency $f_{Po}$ (122). The controller may measure an equivalent capacitance $C_{eq,Po}$ between capacitance electrodes 44, 48, including a capacitance $C_{Po}$ of material 52 at frequency $f_{Po}$ and a capacitance $C_{A1}$ of air gap 50. The equivalent capacitance $C_{eq,Ph}$ may be represented by the following equation:

$$C_{eq,Po} = \left(\frac{1}{C_A} + \frac{1}{C_{Po}}\right)^{-1}.$$

The capacitance $C_{A1}$ of air gap 50 may be represented by the following equation:

$$C_{A1} = \frac{\varepsilon_0 A}{d_0 - d_M},$$

while the capacitance $C_{Po}$ of material 52 at frequency $f_{Po}$ may be represented by the following equation:

$$C_{Po} = \frac{\varepsilon_{Po} \varepsilon_0 A}{d_M},$$

where $\varepsilon_{Po}$ is the relative permittivity of material 52 at frequency $f_{Po}$. In some examples, the controller may use the capacitance $C_A$ of the first measurement, the free permittivity $\varepsilon_0$, and the equivalent capacitance $C_{eq,Po}$, to determine the capacitance $C_{Po}$ and/or relative permittivity $\varepsilon_{Po}$ of material 52 at frequency $f_{Po}$.

The technique of FIG. 8 may further include depositing a second material, such as coating 112, on material 52 (not shown). For example, an environmental barrier coating may be applied to material 52 to protect material 52 from deterioration. In some examples, coating 112 may have more than one layer deposited. For examples of coating 112, see material 8 of FIG. 1. Air gap 50 may have a new distance $d_{A2}$ due to space taken up by material 52 and coating 112.

Figure 9C:
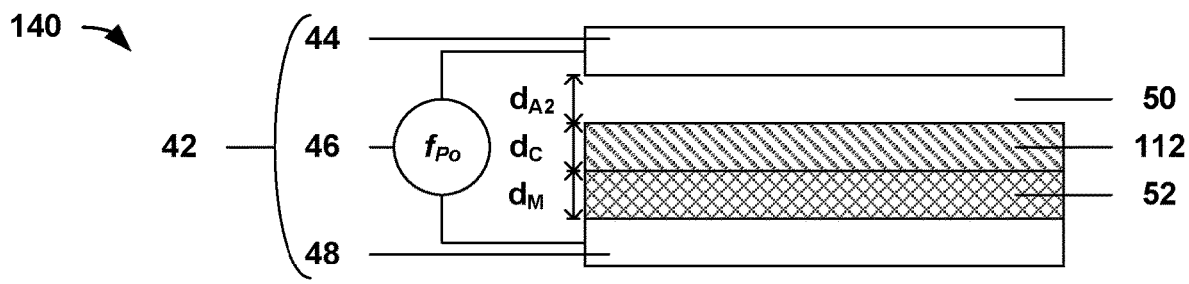
FIG. 9C is a diagram of an example system for measuring a capacitance of a first material and a second material at a frequency for determining a porosity.

The technique of FIG. 6 may include causing, by the controller, capacitance probe 42 to subject material 52 and coating 112 to an electric signal having a frequency $f_{Po}$ (124). In some examples, the frequency $f_{Po}$ may be selected so that the first constituent phase or layer and the second constituent phase or layer have substantially similar dielectric constants at the frequency $f_{Po}$. FIG. 9C is a diagram system 140 for measuring a capacitance of material 52 and coating 112 at a frequency $f_{Po}$ for determining a porosity.

The technique of FIG. 8 may further include determining, by the controller, a capacitance of material 52 and coating 112 at the frequency $f_{Po}$ (126). The controller may measure an equivalent capacitance $C_{eq,CoPo}$ between capacitance electrodes 44, 48, including a capacitance $C_{Po}$ of material 52 at frequency $f_{Po}$, a capacitance $C_{CoPo}$ of coating 112 at frequency $f_{Po}$, and a capacitance $C_{A2}$ of air gap 50. The equivalent capacitance $C_{eq,CoPo}$ may be represented by the following equation:

$$C_{eq,CoPo} = \left(\frac{1}{C_{A2}} + \frac{1}{C_{Po}} + \frac{1}{C_{CoPo}}\right)^{-1}.$$

The capacitance $C_{A2}$ of air gap 50 may be represented by the following equation:

$$C_{A2} = \frac{\varepsilon_0 A}{d_0 - d_C - d_M},$$

where $d_C$ is a thickness of the coating 112. The capacitance $C_{CoPo}$ of material 52 at frequency $f_{Po}$ may be represented by the following equation:

$$C_{CoPo} = \frac{\varepsilon_{CoPo} \varepsilon_0 A}{d_C},$$

where $C_{CoPh}$ is the relative permittivity of coating 112 at frequency $f_{Po}$. In some examples, the controller may use the permittivity of free space co, the equivalent capacitance $C_{eq,CoPo}$, and the capacitance $C_{Po}$ of material 52 at frequency $f_{Po}$, to determine the capacitance $C_{CoPo}$ of coating 112 at frequency $f_{Po}$.

The technique of FIG. 8 may further include determining, by the controller, a porosity of coating 112 (128). The controller may use any technique that determines a property fraction of pore medium from capacitance of material 52. In some examples, the controller may determine a volume fraction of material 52 and pore medium by evaluating the relative permittivity $\varepsilon_{Po}$ with respect to a dielectric constant of the pore medium and a dielectric constant of material 52.

The technique of FIG. 8 may include causing, by the controller, an electrolyte source to deposit electrolyte solution to at least one surface of coating 112 (not shown). In some examples, the controller may cause the electrolyte source to immerse coating 112 in the electrolyte solution. In other examples, the controller may cause the electrolyte source to deposit electrolyte solution to a top surface of coating 112. Electrolyte solution may substantially fill open pores of a portion of coating 112, such as greater than 90% of open pores. Electrolyte solution 52 may also replace air gaps, such as air gap 50, between capacitive electrodes 44, 48.

Figure 9D:
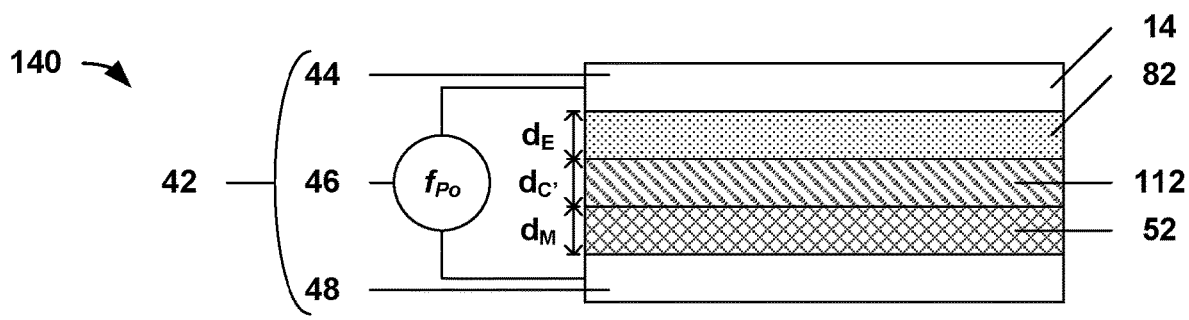
FIG. 9D is a diagram of an example system for measuring a capacitance of a first material and a second material immersed in electrolyte solution at a frequency for determining a porosity.

FIG. 9D is a diagram of system 140 for measuring a capacitance of material 52 and coating 112 immersed in electrolyte solution at a frequency $f_{Po}$ for determining a porosity. Material 52, coating 112, and electrolyte layer 82 may be positioned between capacitance electrodes 44, 48. Electrolyte layer 82 may have a thickness $D_E$ that replaces air gap 50. Coating 112 may have a new thickness $d_{C'}$ due to immersion of electrolyte into coating 112. The technique of FIG. 8 may include causing, by the controller, capacitance probe 42 to subject material 52, immersed in electrolyte solution, to an electric signal having the frequency $f_{Po}$ (130).

The technique of FIG. 8 may further include determining, by the controller, a capacitance of material 52 and coating 112, immersed in electrolyte solution, at the frequency $f_{Po}$ (132). The controller may measure an equivalent capacitance $C_{eq,CoCP}$ between capacitance electrodes 44, 48, including a capacitance $C_{Po}$ of material 52, a closed pore capacitance $C_{CoCP}$ of coating 112, and a capacitance $C_E$ of electrolyte layer 82. The equivalent capacitance $C_{eq,CoCP}$ may be represented by the following equation:

$$C_{eq,CoCP} = \left(\frac{1}{C_E} + \frac{1}{C_{Po}} + \frac{1}{C_{CoCP}}\right)^{-1}$$

The capacitance $C_E$ of electrolyte layer 82 may be negligible, as a permittivity value of the electrolyte layer may be very low.

The closed pore capacitance $C_{CoCP}$ of coating 112 may be represented by the following equation:

$$C_{CoCP} = \frac{\varepsilon_{CoCP}\varepsilon_0 A}{d_{C'}},$$

where $\varepsilon_{CoCP}$ is the closed pore permittivity of coating 112 at frequency $f_{Po}$. Due to the negligible permittivity of the electrolyte layer 82, the equivalent capacitance $C_{eq,CoCP}$ may be related to the capacitance $C_{Po}$ of material 52 at frequency $f_{Po}$ and the closed pore capacitance $C_{CoCP}$ of coating 112 at frequency $f_{Po}$.

The technique of FIG. 8 may further include determining, by the controller, a closed porosity and an open porosity of material 52 (134). In some examples, the controller may determine a volume fraction of closed pores and open pores by evaluating the closed pore relative permittivity $\varepsilon_{Po}$ of material coating 112 at frequency $f_{Po}$ with respect to the porosity of coating 112.

The technique of FIG. 8 may further include causing, by the controller, capacitance probe 42 to be positioned over a different portion of material 52. Controller 16 may reposition capacitance probe 4 at a different portion of material 52 (136). Before step 120 discussed above, the controller may cause capacitance probe 42 to be positioned over a portion of material 52. After determining a capacitance of the first material, as in step 122, or an open porosity and a closed porosity of material 52, as in step 134, the controller may determine additional portions of material 52 for which to determine an open or closed porosity. The controller may cause capacitance probe 42 to be positioned over a different portion of material 52. The controller may generate a representation of relative composition as a function of portion of coating 112 (138). The controller may cause a user interface device to output the representation of the relative composition.

The techniques discussed in FIGS. 2-9 may be further used to determine material properties for more than one portion of a material. For example, gantry system 14 of FIG. 1 may move capacitance probes 4 and 42 to different portions of a material 8 and 52 to determine a spatial map of material 8 and 52. The spatial map may include spatial compositional information of the material, such as capacitance, permittivity, porosity, phase composition, layer composition, open/closed porosity, and the like. The spatial information may be stored, for example, in a data base and any changes in the materials may be tracked. For example, a thickness of coating 112 of FIG. 7 may be tracked over time to monitor coating 112 for deterioration. In other examples, the spatial map may determine variation in the spatial information. For example, a material or coating may have a specific variance tolerance over an entire area of the material or coating. The spatial map may have a spatial resolution which may depend on, for example, physical dimensions of the capacitance probe, such as capacitance electrode area and geometry.

Figure 11:
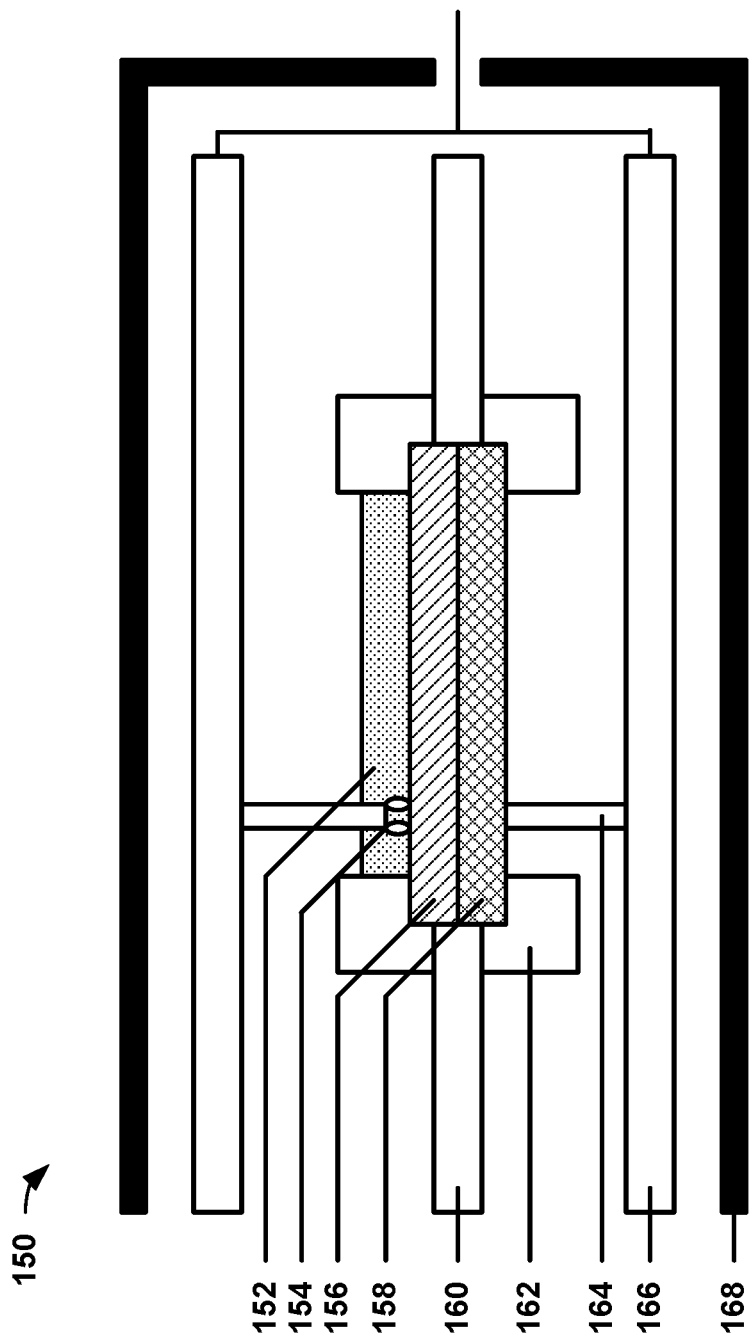
FIG. 11 is a diagram of an example system for determining a compositional property of a material, such as a base material and a coating, using capacitance.

FIG. 11 is a diagram of an example system 150 for determining a compositional property of a material, such as material 158 and coating 156, using capacitance. Components of FIG. 11 may be substantially the same as similar components of FIG. 1. For example, system 2, vessel 6, material 8, gantry system 14, and capacitance electrodes 18A and 18B may correspond to system 150, a vessel 168, material 158 and coating 156, a gantry system 166, and capacitance electrode(s) 164, respectively. System 150 may include vessel 168 to house material 158 and coating 156. Vessel 168 includes gantry system 166 for moving two or more capacitance electrodes 164 of a capacitance probe to different portions of material 158 and coating 156. An insulated clamping mechanism 162 may secure material 158 and coating 156, while an insulated stand 160 may secure insulated clamping mechanism 162 to vessel 168. An O-ring/guard ring structure 154 may create a seal around capacitance electrode 164 contacting electrolyte solution 152.

Various examples have been described. These and other examples are within the scope of the following claims.

What is claimed is:

1. A method, comprising:
    causing, by a controller, a capacitance probe to subject a material to an electric signal having a frequency, wherein the material includes a first solid constituent phase and a second solid constituent phase, and wherein the first solid constituent phase and the second solid constituent phase have substantially different dielectric constants at the frequency;
    determining, by the controller, a capacitance of the material; and determining, by the controller, a relative phase composition of the first solid constituent phase and the second solid constituent phase based on the capacitance.

2. The method of claim 1, wherein determining the relative phase composition further comprises determining a contribution of each of a first dielectric constant of the first solid constituent phase and a second dielectric constant of the second solid constituent phase to a permittivity of the material at the frequency.

3. The method of claim 1, wherein the first solid constituent phase comprises a first layer and the second solid constituent phase comprises a second layer overlying the first layer, and wherein determining the relative phase composition comprises determining a relative thickness of the first layer and the second layer.

4. The method of claim 3, further comprising determining, by the controller, a thickness of the second layer based on a thickness of the first layer and the relative thickness of the first layer and the second layer.

5. The method of claim 1, wherein determining the relative phase composition of the first solid constituent phase and the second solid constituent phase based on the capacitance further comprises:
determining, by the controller, a permittivity of the first solid constituent phase and the second solid constituent phase; and
determining, by the controller, the relative phase composition of the material based on the permittivity of the first solid constituent phase and the second solid constituent phase based on equation:

$$\varepsilon_R = \varepsilon_{M,1} V_{M,1} + \varepsilon_{M,2} V_{M,2}$$

where $\varepsilon_{M,1}$ is a relative permittivity of the first solid constituent phase, $V_{M,1}$ is a volume fraction of the first solid constituent phase, $\varepsilon_{M,2}$ is a relative permittivity of the second solid constituent phase, and $V_{M,2}$ is a volume fraction of the second solid constituent phase.

6. The method of claim 1, wherein the electric signal comprises a first electric signal, and wherein the capacitance comprises a first capacitance, the method further comprising:
causing, by the controller, the capacitance probe to be positioned over a different portion of the material;
causing, by the controller, the capacitance probe to subject the different portion of the material to a second electric signal having the frequency;
determining, by the controller, a second capacitance of the different portion of the material; and
determining, by the controller, a relative phase composition of the first solid constituent phase and the second solid constituent phase of the second portion of the material based on the second capacitance.

7. The method of claim 1, further comprising:
generating, by the controller, a representation of relative phase composition of the first solid constituent phase and the second solid constituent phase as a function of portion of the material; and
causing, by the controller, a user interface device to output the representation of relative phase composition.

8. The method of claim 1, wherein the electric signal is a first electric signal, wherein the frequency is a first frequency, and wherein the method further comprises:
causing, by the controller, the capacitance probe to subject the material to a second electric signal having a second frequency, wherein the first solid constituent phase and the second solid constituent phase have substantially similar dielectric constants at the second frequency;
determining, by the controller, a second capacitance of the material at the second frequency; and
determining, by the controller, a porosity of the material based on the second capacitance.

9. A method, comprising:
causing, by a controller, a capacitance probe to subject a first material to a first electric signal;
determining, by the controller, a first capacitance of the first material;
causing, by a controller, a capacitance probe to subject the first material and a second material to a second electric signal having a frequency, wherein the second material includes a first constituent phase and a second constituent phase, and wherein the first constituent phase and the second constituent phase have substantially different dielectric constants at the frequency;
determining, by the controller, a second capacitance of the first material and the second material;
determining, by the controller, a relative phase composition of the first constituent phase and the second constituent phase of the second material based on the first capacitance and the second capacitance.

10. The method of claim 9, wherein determining the relative phase composition further comprises determining a contribution of each of a first dielectric constant of the first constituent phase and a second dielectric constant of the second constituent phase to a permittivity of the second material at the frequency.

11. The method of claim 9, wherein the first constituent phase comprises a first layer and the second constituent phase comprises a second layer overlying the first layer, and wherein determining the relative phase composition comprises determining a relative thickness of each layer of the second material or a relatively uniformity of each layer of the second material.

12. The method of claim 9, wherein determining, by the controller, the relative phase composition of the first constituent phase and the second constituent phase of the second material based on the capacitance further comprises:
determining, by the controller, a permittivity of the first constituent phase and the second constituent phase; and
determining, by the controller, the relative phase composition of the second material based on the permittivity of the first constituent phase and the second constituent phase based on equation:

$$\varepsilon_R = \varepsilon_{M,1} V_{M,1} + \varepsilon_{M,2} V_{M,2}$$

where $\varepsilon_{M,1}$ is a relative permittivity of the first constituent phase, $V_{M,1}$ is a volume fraction of the first constituent phase, $\varepsilon_{M,2}$ is a relative permittivity of the second constituent phase, and $V_{M,2}$ is a volume fraction of the second constituent phase.

13. The method of claim 9, further comprising:
causing, by the controller, the capacitance probe to be positioned over a different portion of the second material;
causing, by the controller, the capacitance probe to subject the different portion of the second material to a third electric signal having the frequency;
determining, by the controller, a third capacitance of the different portion of the second material; and
determining, by the controller, a relative phase composition of the first constituent phase and the second constituent phase of the second portion of the second material based on the third capacitance.

14. The method of claim 9, further comprising:
generating, by the controller, a representation of relative phase composition of the first constituent phase and the second constituent phase as a function of portion of the second material; and
causing, by the controller, a user interface device to output the representation of relative phase composition.

15. The method of claim 9, further comprising depositing the second material on the first material.

16. The method of claim 9, wherein the frequency is a first frequency, and wherein the method further comprises:
causing, by the controller, the capacitance probe to subject the first and the second material to a third electric signal having a second frequency, wherein the first constituent phase and the second constituent phase of the second material have substantially similar dielectric constants at the second frequency;
determining, by the controller, a third capacitance of the material at the second frequency; and
determining, by the controller, a porosity of the material based on the third capacitance.

17. A system, comprising:
a capacitance probe; and
a controller communicatively coupled to the capacitance probe, wherein the controller is configured to:
cause the capacitance probe to subject a material to an electric signal having a frequency, wherein the material includes a first solid constituent phase and a second solid constituent phase, and wherein the first solid constituent phase and the second solid constituent phase have substantially different dielectric constants at the frequency;
determine a capacitance of the material; and
determine a relative phase composition of the first solid constituent phase and the second solid constituent phase based on the capacitance.

18. The system of claim 17, wherein the controller is further configured to control a gantry system to position the capacitance probe over a different portion of the material.

19. The system of claim 18, wherein the controller is further configured to:
generate a representation of relative phase composition of the material as a function of position of the material; and
cause a user interface device to output the representation of relative phase composition.

20. The system of claim 17, wherein the electric signal is a first electric signal, wherein the frequency is a first frequency, and wherein the controller is further configured to:
cause the capacitance probe to subject the material to a second electric signal having a second frequency, wherein the first solid constituent phase and the second solid constituent phase have substantially similar dielectric constants at the second frequency;
determine a second capacitance of the material at the second frequency; and
determine a porosity of the material based on the second capacitance.

* * * * *